(12) United States Patent
Katkar et al.

(10) Patent No.: US 12,374,641 B2
(45) Date of Patent: Jul. 29, 2025

(54) SEALED BONDED STRUCTURES AND METHODS FOR FORMING THE SAME

(71) Applicant: ADEIA SEMICONDUCTOR BONDING TECHNOLOGIES INC., San Jose, CA (US)

(72) Inventors: Rajesh Katkar, Milpitas, CA (US); Arkalgud R. Sitaram, Cupertino, CA (US); Laura Wills Mirkarimi, Sunol, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 610 days.

(21) Appl. No.: 16/839,756

(22) Filed: Apr. 3, 2020

(65) Prior Publication Data
US 2020/0395321 A1    Dec. 17, 2020

Related U.S. Application Data

(60) Provisional application No. 62/860,728, filed on Jun. 12, 2019.

(51) Int. Cl.
*H01L 23/48* (2006.01)
*B81B 7/00* (2006.01)
(Continued)

(52) U.S. Cl.
CPC ............ *H01L 24/08* (2013.01); *B81B 7/0006* (2013.01); *B81B 7/0064* (2013.01);
(Continued)

(58) Field of Classification Search
CPC ......... H01L 24/05; H01L 24/08; H01L 24/89; H01L 2224/0057; H01L 2224/05647;
(Continued)

(56) References Cited

U.S. PATENT DOCUMENTS 4,998,665 A    3/1991   Hayashi
5,087,585 A    2/1992   Hayashi
(Continued)

FOREIGN PATENT DOCUMENTS

CN    101554988       10/2009
CN    104779243 A     7/2015
(Continued)

OTHER PUBLICATIONS

International Search Report and Written Opinion mailed Sep. 7, 2020 in International Application No. PCT/US2020/035130, 8 pages.
(Continued)

*Primary Examiner* — Brigitte A Paterson
(74) *Attorney, Agent, or Firm* — Knobbe, Martens, Olson & Bear, LLP

(57) ABSTRACT

A bonded structure is disclosed. The bonded structure includes a first element that has a front side and a back side that is opposite the front side. The first element has a first conductive pad and a first nonconductive field region at the front side of the first element. The bonded structure also includes a second element that has a second conductive pad and a second nonconductive field region at a front side of the second element. The second conductive pad is bonded to the first conductive pad along an interface structure. The bonded structure also includes an integrated device that is coupled to or formed with the first element or the second element. The bonded structure further includes an elongate conductive structure that extends from the back side of the first element to the interface structure. The elongate conductive structure provides an effectively closed profile around the integrated device.

49 Claims, 28 Drawing Sheets

(51) Int. Cl.
  *B81C 1/00* (2006.01)
  *H01L 23/00* (2006.01)
  *H01L 23/552* (2006.01)
  *H01L 23/58* (2006.01)

(52) U.S. Cl.
  CPC ........ *B81C 1/0023* (2013.01); *B81C 1/00269* (2013.01); *H01L 23/481* (2013.01); *H01L 23/552* (2013.01); *H01L 23/585* (2013.01); *H01L 24/05* (2013.01); *H01L 24/89* (2013.01); *B81B 2203/0315* (2013.01); *B81B 2203/04* (2013.01); *B81B 2207/012* (2013.01); *B81B 2207/07* (2013.01); *B81C 2203/0109* (2013.01); *B81C 2203/019* (2013.01); *B81C 2203/0792* (2013.01); *H01L 24/80* (2013.01); *H01L 2224/0557* (2013.01); *H01L 2224/05647* (2013.01); *H01L 2224/08145* (2013.01); *H01L 2224/08147* (2013.01); *H01L 2224/80001* (2013.01); *H01L 2224/80013* (2013.01); *H01L 2224/80357* (2013.01); *H01L 2224/80895* (2013.01); *H01L 2224/80896* (2013.01); *H01L 2224/80948* (2013.01); *H01L 2224/80986* (2013.01); *H01L 2924/1461* (2013.01)

(58) Field of Classification Search
  CPC . H01L 2224/08145; H01L 2224/08147; H01L 2224/80001; H01L 2224/80013; H01L 2224/80357; H01L 2224/80895; H01L 2224/80896; H01L 2224/80948; H01L 2224/80986; B81B 7/0006; B81B 7/0064; B81B 2207/012; B81B 2207/07; B81B 2203/0315; B81B 2203/04
  See application file for complete search history.

(56) References Cited

U.S. PATENT DOCUMENTS

| | | | |
|---|---|---|---|
| 5,322,593 A | 6/1994 | Hasegawa et al. |
| 5,753,536 A | 5/1998 | Sugiyama et al. |
| 5,771,555 A | 6/1998 | Eda et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,265,775 B1 | 7/2001 | Seyyedy |
| 6,374,770 B1 | 4/2002 | Lee |
| 6,423,640 B1 | 7/2002 | Lee et al. |
| 6,465,892 B1 | 10/2002 | Suga |
| 6,872,984 B1 | 3/2005 | Leung |
| 6,876,062 B2 | 4/2005 | Lee et al. |
| 6,887,769 B2 | 5/2005 | Kellar et al. |
| 6,908,027 B2 | 6/2005 | Tolchinsky et al. |
| 6,998,712 B2 | 2/2006 | Okada et al. |
| 7,045,453 B2 | 5/2006 | Canaperi et al. |
| 7,057,274 B2 | 6/2006 | Heschel |
| 7,078,811 B2 | 7/2006 | Suga |
| 7,105,980 B2 | 9/2006 | Abbott et al. |
| 7,193,423 B1 | 3/2007 | Dalton et al. |
| 7,354,798 B2 | 4/2008 | Pogge et al. |
| 7,359,591 B2 | 4/2008 | Vandentop et al. |
| 7,388,281 B2 | 6/2008 | Krueger et al. |
| 7,467,897 B2 | 12/2008 | Hauffe et al. |
| 7,622,324 B2 | 11/2009 | Enquist et al. |
| 7,750,488 B2 | 7/2010 | Patti et al. |
| 7,768,133 B2 | 8/2010 | Matsui et al. |
| 7,803,693 B2 | 9/2010 | Trezza |
| 7,972,683 B2 | 7/2011 | Gudeman et al. |
| 8,183,127 B2 | 5/2012 | Patti et al. |
| 8,191,756 B2 | 6/2012 | Coppeta et al. |
| 8,241,961 B2 | 8/2012 | Kim et al. |
| 8,269,671 B2 | 9/2012 | Chen et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,395,229 B2 | 3/2013 | Garcia-Blanco et al. |
| 8,411,444 B2 | 4/2013 | Gaynes et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,530,997 B1 | 9/2013 | Yang et al. |
| 8,546,928 B2 | 10/2013 | Merz et al. |
| 8,575,748 B1 | 11/2013 | Farino |
| 8,620,164 B2 | 12/2013 | Heck et al. |
| 8,647,987 B2 | 2/2014 | Yang et al. |
| 8,669,602 B2 | 3/2014 | Hayashi |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,093,350 B2 | 7/2015 | Endo et al. |
| 9,119,313 B2 | 8/2015 | Zhang et al. |
| 9,142,517 B2 | 9/2015 | Liu et al. |
| 9,142,532 B2 | 9/2015 | Suga et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,318,471 B2 | 4/2016 | Kabe et al. |
| 9,337,235 B2 | 5/2016 | Chen et al. |
| 9,368,866 B2 | 6/2016 | Yu |
| 9,385,024 B2 | 7/2016 | Tong et al. |
| 9,386,688 B2 | 7/2016 | MacDonald et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,601,454 B2 | 3/2017 | Zhao et al. |
| 9,620,464 B2 | 4/2017 | Baks et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,768,307 B2 | 9/2017 | Yamazaki et al. |
| 9,799,587 B2 | 10/2017 | Fujii et al. |
| 9,834,435 B1 | 12/2017 | Liu et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |

(56) References Cited

U.S. PATENT DOCUMENTS

| | | |
|---|---|---|
| 10,508,030 B2 | 12/2019 | Katkar et al. |
| 10,522,499 B2 | 12/2019 | Enquist et al. |
| 10,546,832 B2 | 1/2020 | Wang et al. |
| 10,615,133 B2 | 4/2020 | Kamgaing et al. |
| 10,658,312 B2 | 5/2020 | Kamgaing et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,207 B2 | 12/2020 | Wang et al. |
| 10,879,210 B2 | 12/2020 | Enquist et al. |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,205,600 B2 | 12/2021 | Shen et al. |
| 11,256,004 B2 | 2/2022 | Haba et al. |
| 11,257,727 B2 | 2/2022 | Katkar et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,417,576 B2 | 8/2022 | Katkar et al. |
| 11,485,670 B2 | 11/2022 | Ruben et al. |
| 11,600,542 B2 | 3/2023 | Huang et al. |
| 11,670,615 B2 | 6/2023 | Wang et al. |
| 11,948,847 B2 | 4/2024 | Katkar et al. |
| 11,955,393 B2 | 4/2024 | Katkar et al. |
| 12,100,684 B2 | 9/2024 | Wang et al. |
| 2002/0000328 A1 | 1/2002 | Motomura et al. |
| 2002/0003307 A1 | 1/2002 | Suga |
| 2002/0094608 A1 | 7/2002 | Brooks |
| 2002/0179921 A1 | 12/2002 | Cohr |
| 2003/0098060 A1 | 5/2003 | Yoshimi |
| 2004/0084414 A1 | 5/2004 | Sakai et al. |
| 2004/0259325 A1 | 12/2004 | Gan |
| 2005/0009246 A1 | 1/2005 | Enquist et al. |
| 2005/0082653 A1 | 4/2005 | McWilliams et al. |
| 2005/0263866 A1 | 12/2005 | Wan |
| 2006/0001123 A1 | 1/2006 | Heck et al. |
| 2006/0057945 A1 | 3/2006 | Hsu et al. |
| 2006/0097335 A1 | 5/2006 | Kim et al. |
| 2006/0115323 A1 | 6/2006 | Coppeta et al. |
| 2006/0197215 A1 | 9/2006 | Potter |
| 2006/0208326 A1 | 9/2006 | Nasiri et al. |
| 2007/0029562 A1 | 2/2007 | Koizumi |
| 2007/0045781 A1 | 3/2007 | Carlson et al. |
| 2007/0045795 A1 | 3/2007 | McBean |
| 2007/0096294 A1 | 5/2007 | Ikeda et al. |
| 2007/0111386 A1 | 5/2007 | Kim et al. |
| 2007/0134891 A1 | 6/2007 | Adetutu et al. |
| 2007/0188054 A1 | 8/2007 | Hasken et al. |
| 2007/0222048 A1 | 9/2007 | Huang |
| 2007/0295456 A1 | 12/2007 | Gudeman et al. |
| 2008/0080832 A1 | 4/2008 | Chen et al. |
| 2008/0124835 A1 | 5/2008 | Chen et al. |
| 2008/0261344 A1 | 10/2008 | Jafri et al. |
| 2008/0283995 A1 | 11/2008 | Bucki et al. |
| 2008/0290490 A1 | 11/2008 | Fujii et al. |
| 2008/0296709 A1 | 12/2008 | Haba et al. |
| 2009/0053855 A1 | 2/2009 | Summers |
| 2009/0186446 A1 | 7/2009 | Kwon et al. |
| 2009/0267165 A1 | 10/2009 | Okudo et al. |
| 2010/0078786 A1 | 4/2010 | Maeda |
| 2010/0096713 A1 | 4/2010 | Jung |
| 2010/0148341 A1 | 6/2010 | Fuji et al. |
| 2010/0181676 A1 | 7/2010 | Montez et al. |
| 2010/0252898 A1 | 10/2010 | Tanaka et al. |
| 2010/0288525 A1 | 11/2010 | Basavanhally et al. |
| 2010/0301432 A1 | 12/2010 | Kittilsland et al. |
| 2010/0314149 A1 | 12/2010 | Gerrish et al. |
| 2011/0031633 A1 | 2/2011 | Hsu et al. |
| 2011/0115092 A1 | 5/2011 | Tago |
| 2011/0147859 A1 | 6/2011 | Tanaka et al. |
| 2011/0156242 A1 | 6/2011 | Sakaguchi et al. |
| 2011/0180921 A1 | 7/2011 | Loiselet |
| 2011/0290552 A1 | 12/2011 | Palmateer et al. |
| 2012/0061776 A1 | 3/2012 | Cheng et al. |
| 2012/0097733 A1 | 4/2012 | Ebefors et al. |
| 2012/0100657 A1 | 4/2012 | Di Cioccio et al. |
| 2012/0112335 A1 | 5/2012 | Ebefors et al. |
| 2012/0142144 A1 | 6/2012 | Taheri |
| 2012/0212384 A1 | 8/2012 | Kam et al. |
| 2012/0267730 A1 | 10/2012 | Renard et al. |
| 2012/0286380 A1 | 11/2012 | Yazdi et al. |
| 2012/0326248 A1 | 12/2012 | Daneman et al. |
| 2013/0099331 A1 | 4/2013 | Chen et al. |
| 2013/0122702 A1 | 5/2013 | Volant et al. |
| 2013/0187245 A1 | 7/2013 | Chien et al. |
| 2013/0271066 A1 | 10/2013 | Signorelli et al. |
| 2013/0277774 A1 | 10/2013 | Frey et al. |
| 2013/0277777 A1 | 10/2013 | Chang et al. |
| 2013/0293428 A1 | 11/2013 | Souriau et al. |
| 2014/0042593 A1 | 2/2014 | Mauder et al. |
| 2014/0175655 A1 | 6/2014 | Chen et al. |
| 2014/0197534 A1 | 7/2014 | Partosa et al. |
| 2014/0217557 A1 | 8/2014 | Chen et al. |
| 2014/0225206 A1 | 8/2014 | Lin et al. |
| 2014/0225795 A1 | 8/2014 | Yu |
| 2014/0264653 A1 | 9/2014 | Cheng et al. |
| 2014/0361413 A1 | 12/2014 | Chapelon |
| 2015/0001632 A1 | 1/2015 | Liu et al. |
| 2015/0064498 A1 | 3/2015 | Tong |
| 2015/0068666 A1 | 3/2015 | Abe et al. |
| 2015/0091153 A1 | 4/2015 | Liu et al. |
| 2015/0097215 A1 | 4/2015 | Chu et al. |
| 2015/0137345 A1 | 5/2015 | Choi et al. |
| 2015/0298965 A1 | 10/2015 | Tsai et al. |
| 2015/0336790 A1 | 11/2015 | Geen et al. |
| 2015/0336792 A1 | 11/2015 | Huang et al. |
| 2016/0002029 A1 | 1/2016 | Nasiri et al. |
| 2016/0016789 A1 | 1/2016 | Yu et al. |
| 2016/0107881 A1 | 4/2016 | Thompson et al. |
| 2016/0137492 A1 | 5/2016 | Cheng et al. |
| 2016/0146851 A1 | 5/2016 | Kamisuki |
| 2016/0229685 A1 | 8/2016 | Boysel |
| 2016/0240495 A1 | 8/2016 | Lachner et al. |
| 2016/0318757 A1 | 11/2016 | Chou et al. |
| 2016/0343682 A1 | 11/2016 | Kawasaki |
| 2017/0001858 A1 | 1/2017 | Adams et al. |
| 2017/0008757 A1 | 1/2017 | Cheng et al. |
| 2017/0062366 A1 | 3/2017 | Enquist |
| 2017/0081181 A1 | 3/2017 | Zhang et al. |
| 2017/0135240 A1 | 5/2017 | Pahl |
| 2017/0137281 A1 | 5/2017 | Favier et al. |
| 2017/0179029 A1 | 6/2017 | Enquist et al. |
| 2017/0186732 A1* | 6/2017 | Chu .................. H01L 24/82 |
| 2017/0194271 A1 | 7/2017 | Hsu et al. |
| 2017/0200711 A1 | 7/2017 | Uzoh et al. |
| 2017/0305738 A1 | 10/2017 | Chang et al. |
| 2017/0338214 A1 | 11/2017 | Uzoh et al. |
| 2018/0044175 A1 | 2/2018 | Ogashiwa et al. |
| 2018/0047682 A1 | 2/2018 | Chang et al. |
| 2018/0096931 A1 | 4/2018 | Huang et al. |
| 2018/0174995 A1 | 6/2018 | Wang et al. |

(56) References Cited

U.S. PATENT DOCUMENTS

| | | |
|---|---|---|
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0269161 A1 | 9/2018 | Wu et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2019/0051628 A1 | 2/2019 | Liu et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0164914 A1 | 5/2019 | Hu et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0363079 A1 * | 11/2019 | Theil .................... H01L 23/481 |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043817 A1 | 2/2020 | Shen et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0131028 A1 | 4/2020 | Cheng et al. |
| 2020/0140267 A1 | 5/2020 | Katkar et al. |
| 2020/0140268 A1 | 5/2020 | Katkar et al. |
| 2020/0144217 A1 | 5/2020 | Enquist et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0134689 A1 | 5/2021 | Huang et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0202428 A1 | 7/2021 | Wang et al. |
| 2021/0242152 A1 | 8/2021 | Fountain, Jr. et al. |
| 2021/0265227 A1 | 8/2021 | Katkar et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2022/0367302 A1 | 11/2022 | Katkar et al. |
| 2022/0415734 A1 | 12/2022 | Katkar et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0260858 A1 | 8/2023 | Huang et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361072 A1 | 11/2023 | Wang et al. |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2023/0420313 A1 | 12/2023 | Katkar et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0120245 A1 | 4/2024 | Katkar et al. |
| 2024/0162102 A1 | 5/2024 | Katkar et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0249985 A1 | 7/2024 | Katkar et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |

FOREIGN PATENT DOCUMENTS

| | | |
|---|---|---|
| CN | 109390305 A | 2/2019 |
| EP | 2813465 A1 | 12/2014 |

(56) References Cited

FOREIGN PATENT DOCUMENTS

| | | |
|---|---|---|
| JP | H10-112517 | 4/1998 |
| JP | 2000-100679 | 4/2000 |
| JP | 2001-102479 | 4/2001 |
| JP | 2001-148436 | 5/2001 |
| JP | 2002-353416 | 12/2002 |
| JP | 2008-130915 | 6/2008 |
| JP | 2009-014469 A | 1/2009 |
| JP | 2009-039843 | 2/2009 |
| JP | 2009-238905 | 10/2009 |
| JP | 2010-199608 | 9/2010 |
| JP | 2011054637 A | 3/2011 |
| JP | 2011-131309 | 7/2011 |
| JP | 2012204443 A | 10/2012 |
| JP | 2013-33786 | 2/2013 |
| JP | 2013-513227 | 4/2013 |
| JP | 2013-243333 | 12/2013 |
| JP | 2014-219321 | 11/2014 |
| JP | 2015-100886 | 6/2015 |
| JP | 2015-153791 | 8/2015 |
| JP | 2016-099224 | 5/2016 |
| JP | 2018-160519 | 10/2018 |
| KR | 10-2005-0101324 | 10/2005 |
| KR | 10-2015-0097798 | 8/2015 |
| KR | 10-2017-0108143 | 9/2017 |
| TW | 201210098 A1 | 3/2012 |
| TW | 201423876 A | 6/2014 |
| TW | 201517175 A | 5/2015 |
| TW | 1533399 B | 5/2016 |
| WO | WO 2005/043584 A2 | 5/2005 |
| WO | WO 2006/100444 A1 | 9/2006 |
| WO | WO 2007/103224 A2 | 9/2007 |
| WO | WO 2012/130730 A1 | 10/2012 |
| WO | WO 2014-074403 A1 | 5/2014 |
| WO | WO 2017/100256 A1 | 6/2017 |
| WO | WO 2017/151442 A1 | 9/2017 |

OTHER PUBLICATIONS

"The Advantages of Integrated MEMS to Enable the Internet of Moving Things", mCube, White Paper Jan. 2018.
Amirfeiz et al., "Formation of silicon structures by plasma-activated wafer bonding," Journal of The Electrochemical Society, 2000, vol. 147, No. 7, pp. 2693-2698.
Beer et al., "Coplanar 122GHz Antenna Array With Air Cavity Reflector for Integration in Plastic Packages", IEEE Antennas and Wireless Propagation Letters, 11:160-163, Jan. 2012.
Ceramic Microstructures: Control at the Atomic Level, Recent Progress in Surface Activated Bonding, 1998, pp. 385-389.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method, " Applied Surface Science, Jun. 2, 1997, vols. 117-118, pp. 808-812.
Daneman, "Applying the CMOS Test Flow to MEMS Manufacturing", InvenSense, Inc., accessed on Apr. 5, 2020.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Gu et al., "A Multilayer Organic Package with 64 Dual-Polarized Antennas for 28GHz 5G Communication", IBM Research, pp. 1-3, 2017.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs-Si and InP-Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
Inertial MEMS Manufacturing Trends 2014 Report by Yole Developpement Sample Report, Slide 11, https://www.slideshare.net/Yole_Developpement/yole-inertial-memsmanufacturingtrends2014sample.
International Search Report and Written Opinion mailed Apr. 13, 2018 in International Application No. PCT/US2017/067742, 14 pages.
International Search Report and Written Opinion mailed Apr. 16, 2018 in International Application No. PCT/US2017/067741, 17 pages.
International Search Report and Written Opinion mailed Apr. 22, 2019 in International Application No. PCT/US2018/064982, 13 pages.
International Search Report and Written Opinion mailed Aug. 26, 2019 in International Application No. PCT/US2019/031113, 14 pages.
International Search Report and Written Opinion mailed Mar. 7, 2019, in International Application No. PCT/US2018/060044, 14 pages.
International Search Report and Written Opinion mailed May 31, 2018 in International Application No. PCT/US2018/022688, 2 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of Mems Ic probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.

(56) References Cited

OTHER PUBLICATIONS

Matsuzawa et al., "Room-temperature interconnection of electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Norton, Francis, "Permeation of gases through solids," Journal of Applied Physics, Jan. 1957, vol. 28, No. 1.
Oberhammer, J et al., "Sealing of adhesive bonded devices on wafer level," Sensors and Actuators A, 2004, vol. 110, No. 1-3, pp. 407-412, see pp. 407-412, and Figures 1(a)-1(l), 6 p.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu-Cu direct bump bonding, IEMT/IMC Symposium, 1997, Joint International Electronic Manufacturing Symposium and the International Microelectronics Conference," Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electornic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.

Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5012 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding, Journal of Microelectomechanical systems," Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Zhang et al., "Antenna-on-Chip and Antenna-in-Package Solutions to Highly Integrated Millimeter-Wave Devices for Wireless Communications", IEEE Transactions on Antennas and Propagation, 57(10):2830-2841, Oct. 2009.
Zhou et al., "A Wideband Circularly Polarized Patch Antenna for 60 GHz Wireless Communications", Wireless Engineering and Technology, 3:97-105, 2012.
Zoschke, K. et al., "Hermetic wafer level packaging of MEMS components using through silicon via and wafer to wafer bonding technologies," 2013 Electronic Components & Technology Conference, 2013 IEEE, pp. 1500-1507.
Extended European Search Report dated Feb. 17, 2023, European Application No. 20821631.7, 7 pages.
Android Wiki, "Samsung Galaxy S2," indicating that the Samsung Galaxy S2 was unveiled on Feb. 13, 2011 at the Mobile World Congress (MWC) in Barcelona, https://android.fandom.com/wiki/Samsung_Galaxy_S2 (downloaded Nov. 20, 2023).
Bush, Steve, "Electronica: Automotive power modules from On Semi," ElectronicsWeekly.com, indicating an Onsemi AR0820 product was to be demonstrated at a Nov. 2018 trade show, https://www.

(56) References Cited

OTHER PUBLICATIONS electronicsweekly.com/news/products/power-supplies/electronica-automotive-power-modules-semi-2018-11/ (published Nov. 8, 2018; downloaded Jul. 26, 2023).
Gadgets360, "Sony Xperia S," indicating that the Sony Xperia LT26i product was released on Feb. 12, 2012, https://www.gadgets360.com/sony-xperia-s-609 (downloaded Nov. 20, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Omnivision OV20880 image, cross section of Omnivision product labeled OV20880, showing a hybrid bonded back side illuminated CMOS image sensor device with a pad opening to expose an aluminum bond pad. The part in the image was received on Sep. 24, 2021. Applicant makes no representation that the part in the image is identical to the part identified in the separately submitted reference Omnivision Technologies, Inc. in PR Newswire ("PR Newswire article"); however the imaged part and the part shown in the PR Newsire article share the part name "OV20880."
OmniVision Technologies, Inc., "OmniVision Announces New Family of 20-Megapixel PureCel®Plus-S Sensors for High-End Smartphones," PR Newswire, https://www.prnewswire.com/news-releases/omnivision-announces-new-family-of-20-megapixel-purecelplus-s-sensors-for-high-end-smartphones-300358733.html (dated Nov. 7, 2016; downloaded Nov. 20, 2023).
Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."
Samsung S5K3H2YX03 image, cross section of a back side illuminated CMOS image sensor (CIS) product, taken from Samsung Galaxy S2 phone. The part in the image was shipped on Nov. 25, 2011. The cross section shows tungsten and aluminum lining a trench formed in the back side of the sensor connecting a wire bond with a contact in the image sensor. The second image is a top-down view showing the wire bond pad and the trench that are depicted in the cross section. Applicant makes no representation that the part in the images is identical to image sensor products in the Galaxy S2 product identified in the separately submitted Android Wiki reference https://android.fandom.com/wiki/Samsung_Galaxy_S2 ("Android Wiki article"); however, the imaged sensor was obtained from a product named "Galaxy S2."
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".
Sony Xperia LT26i Sensor image, cross-section of a front side illuminated CMOS image sensor obtained from a Sony Xperia LT26i phone. The part in the image was received on Mar. 29, 2012. The cross section shows a metal line connecting a solder bump at the back side to a contact at the front side of the sensor, with non-conductive epoxy covering the metal. The second image is a bottom-up view of the image sensor. The third image is a bottom-up closeup view showing the edge of the sensor, with the solder bumps and metal line of the cross-section visible. Applicant makes no representation that the part in the images is identical to image sensor products in the Sony Xperia LT26i product identified in the separately submitted Gadgets360 reference https://www.gadgets360.com/sony-xperia-s-609 ("Gadgets360 article"); however, the imaged sensor was obtained from a product named "Sony Xperia LT26i.".
Michailos, Jean, "Future landscape for 3D Integration: from Interposers to 3D High Density," 3d ASIP—Dec. 13-15, 2016, San Francisco Airport, USA, 46 pages.

\* cited by examiner

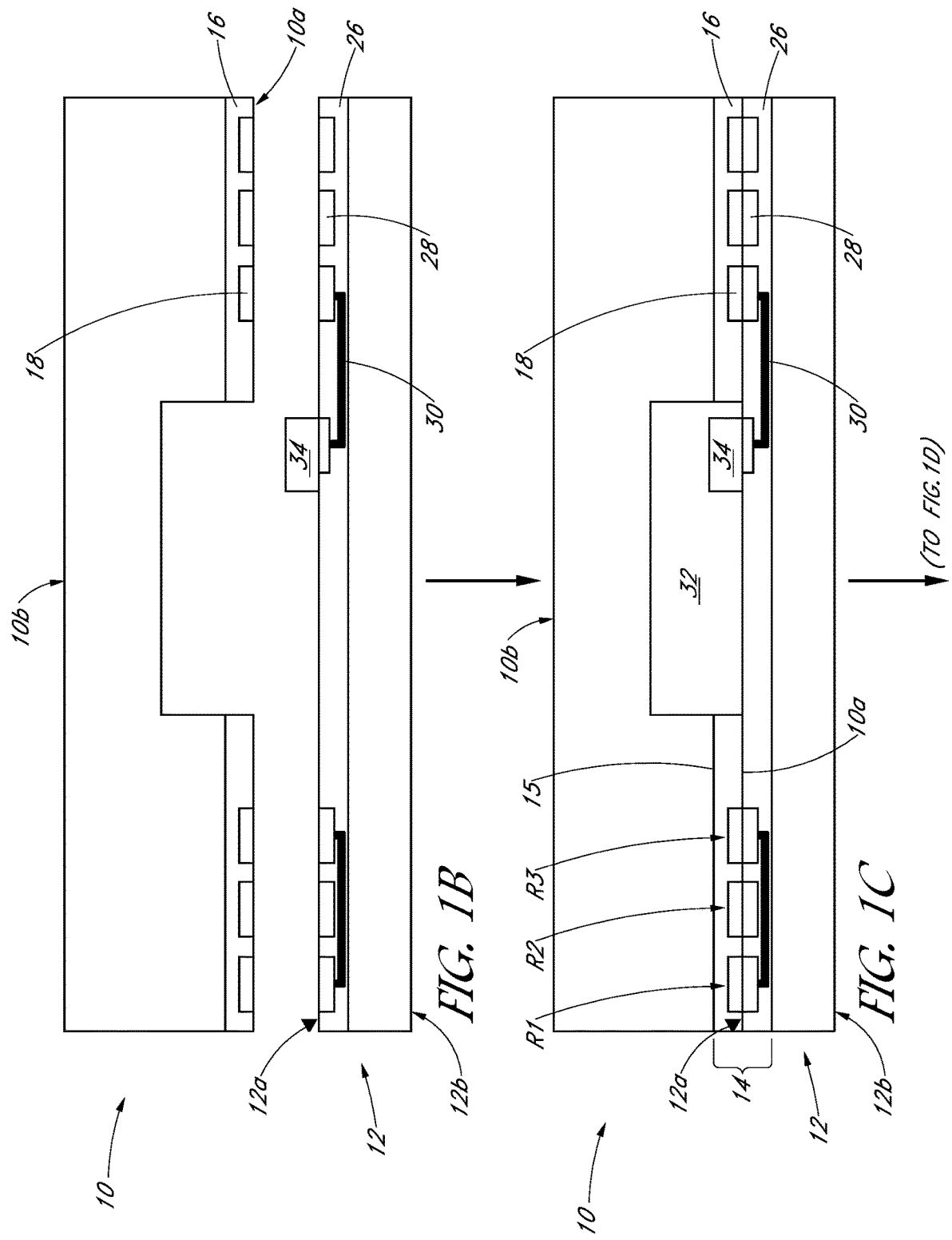

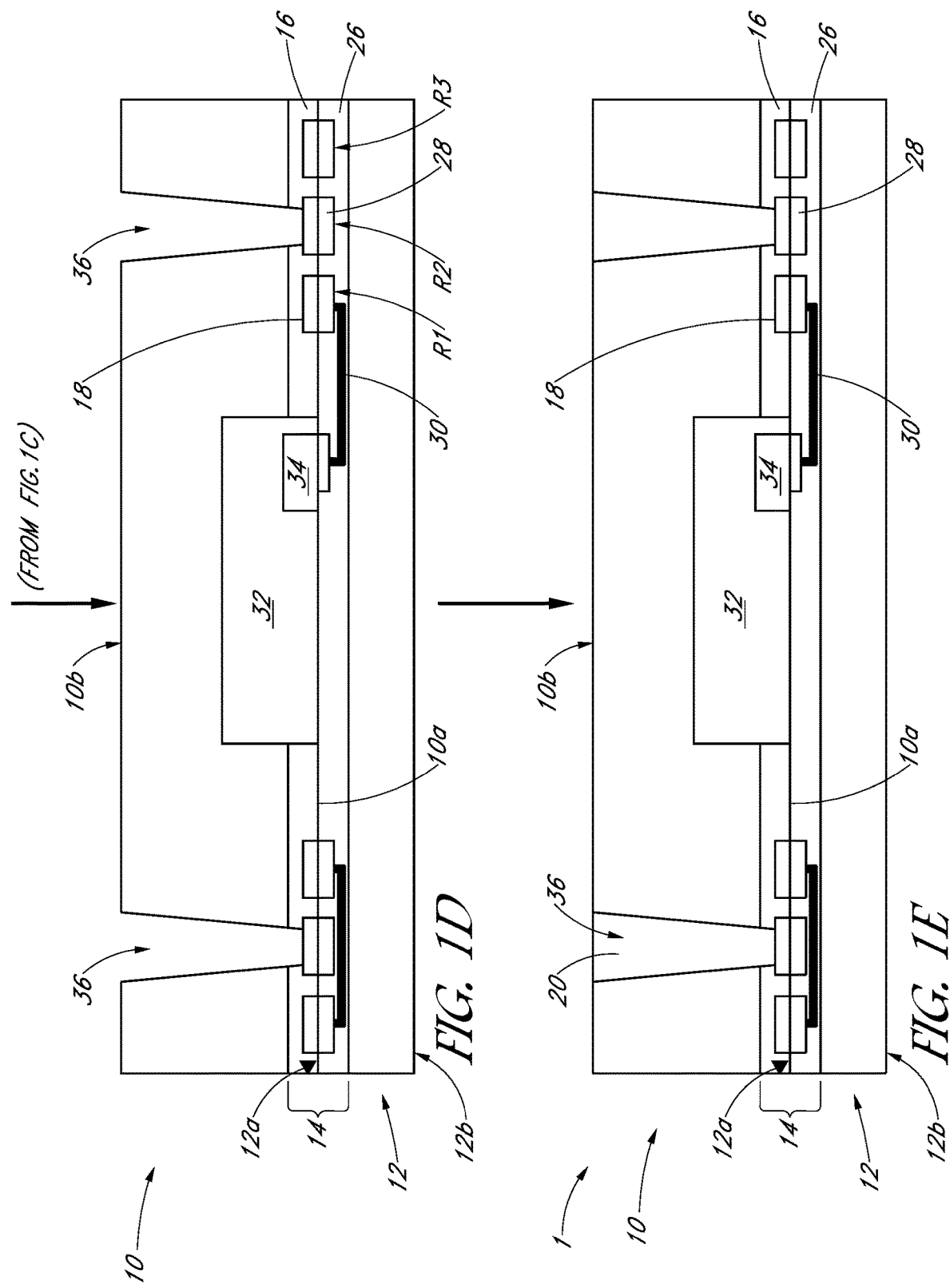

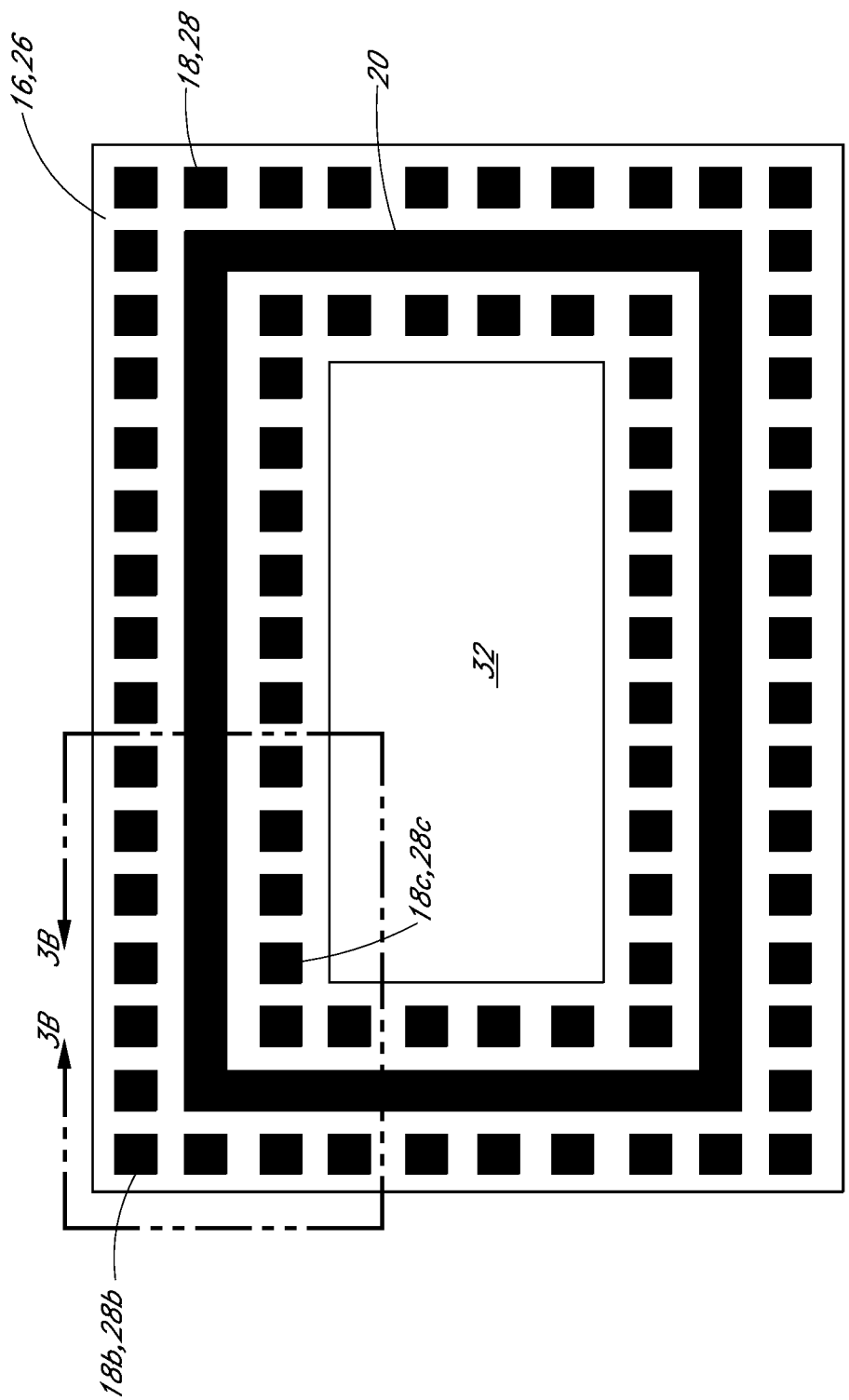

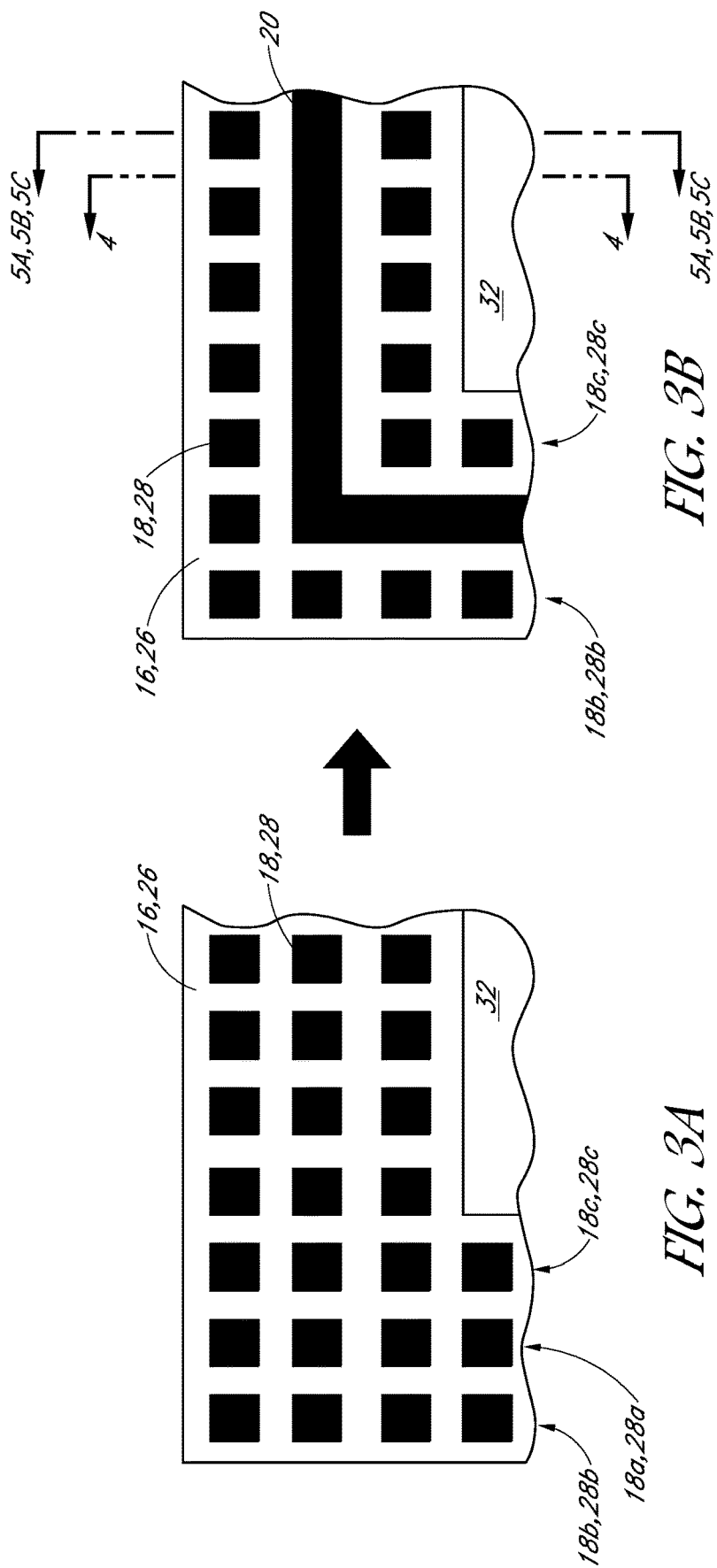

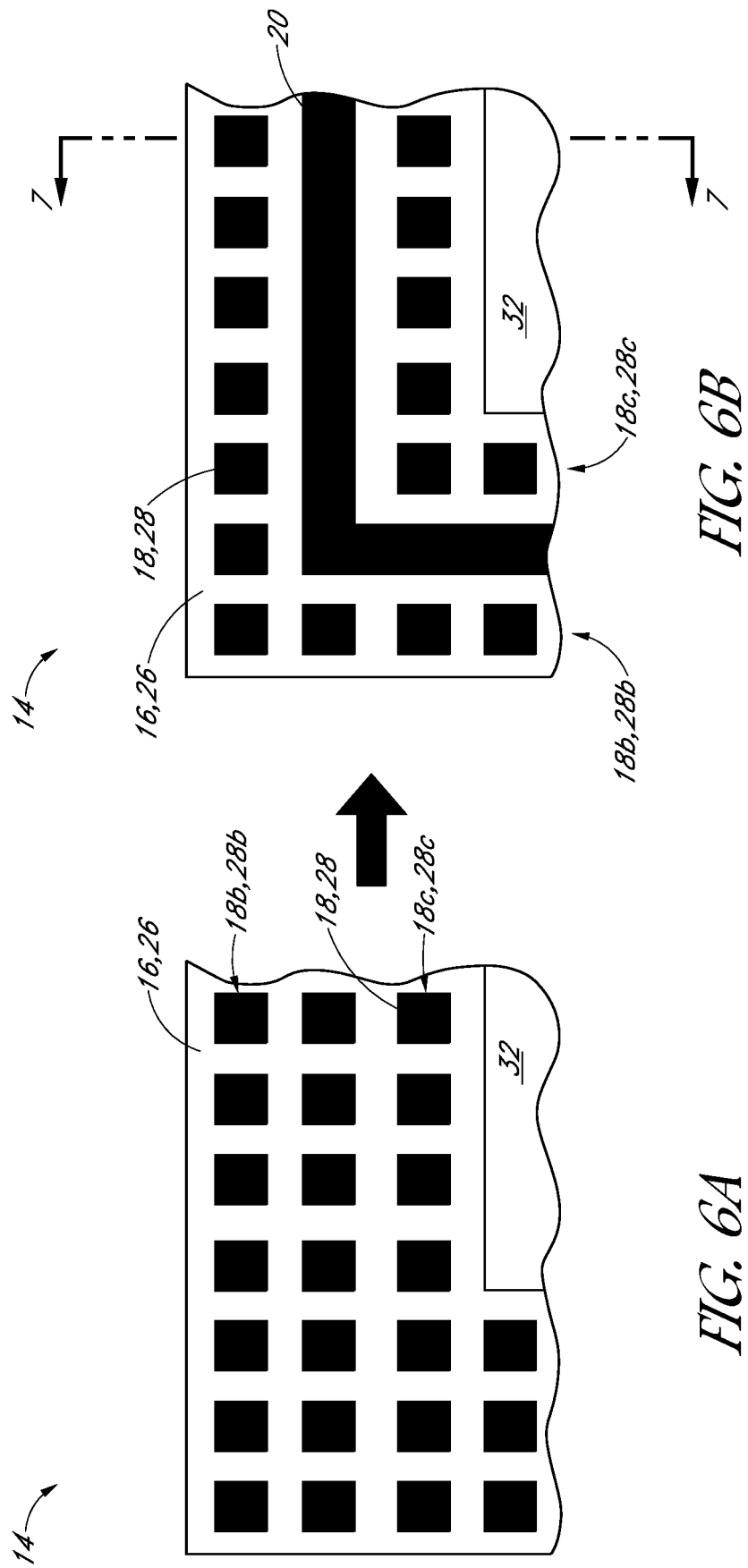

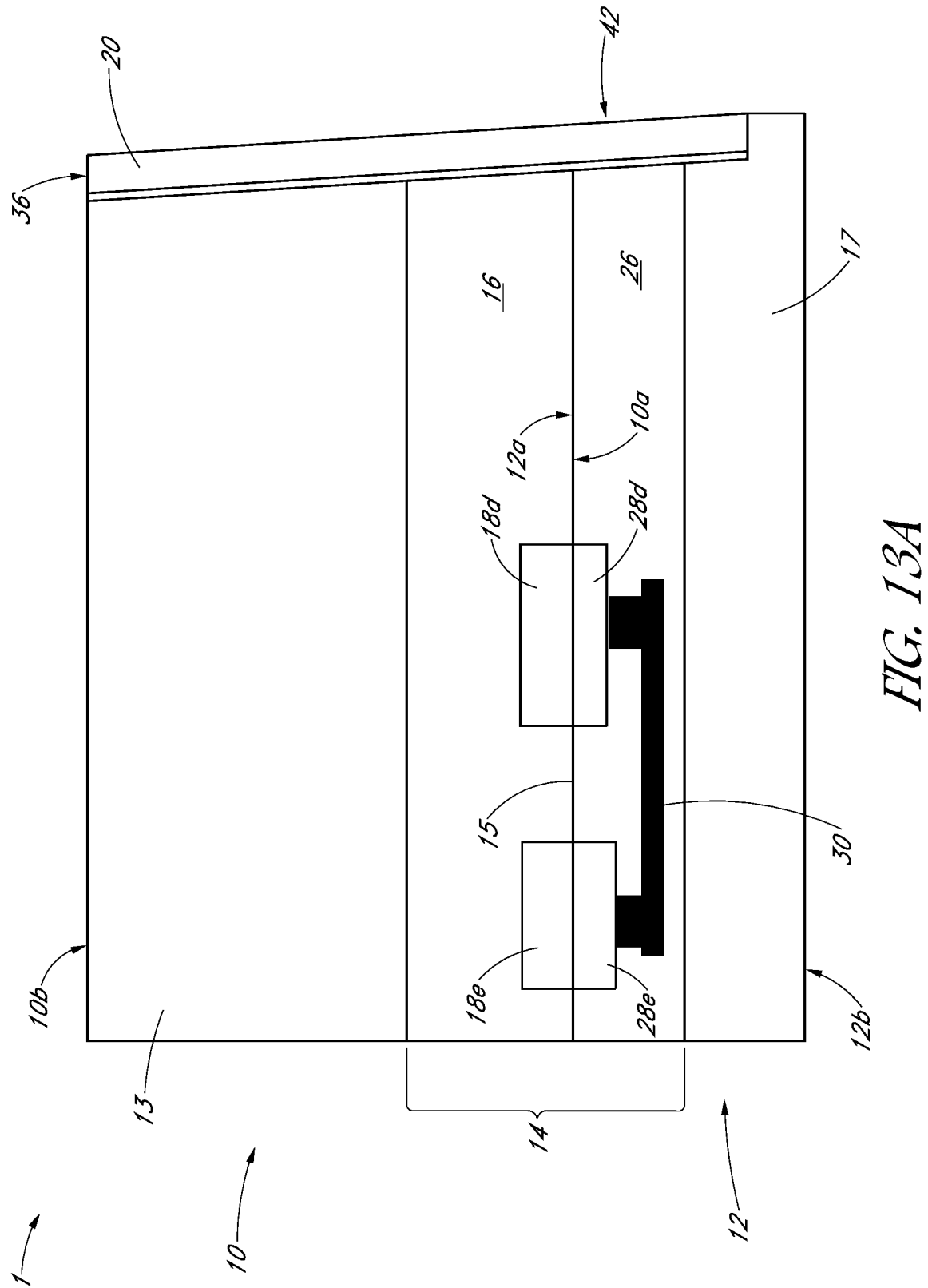

(TO FIG. 14D)

SEALED BONDED STRUCTURES AND METHODS FOR FORMING THE SAME

CROSS-REFERENCE TO RELATED APPLICATIONS

This application claims priority to U.S. Provisional Patent Application No. 62/860,728, filed Jun. 12, 2019, titled "MEMS SEAL RING USING DBI," the entire contents of each of which are hereby incorporated herein by reference.

BACKGROUND

Field of the Invention

The field generally relates to bonded structures, and in particular, to bonded structures that provide improved sealing between two elements (e.g., two semiconductor elements).

Description of the Related Art

In semiconductor device fabrication and packaging, some integrated devices are sealed from the outside environs in order to, e.g., reduce contamination, maintain vacuum or a certain pressure or prevent damage to the integrated device. For example, some microelectromechanical systems (MEMS) devices include a cavity defined by a cap attached to a substrate with an adhesive such as solder. However, some adhesives may be permeable to gases, such that the gases can, over time, pass through the adhesive and into the cavity. Moisture or some gases, such as hydrogen or oxygen gas, can damage sensitive integrated devices or affect the device performance. Other adhesives, such as solder, create their own long-term reliability issues. Accordingly, there remains a continued need for improved seals for integrated devices.

BRIEF DESCRIPTION OF THE DRAWINGS

Specific implementations of the invention will now be described with reference to the following drawings, which are provided by way of example, and not limitation.

FIGS. 1B to 1E illustrate a process flow of manufacturing the bonded structure illustrated in FIG. 1A.

FIG. 2B is a schematic sectional plan view of the interface structure of FIG. 2A, after forming the conductive structure.

FIG. 3A is an enlarged view of a corner of the interface structure illustrated in FIG. 2A.

FIG. 3B is an enlarged view of a corner of the interface structure illustrated in FIG. 2B.

FIG. 6A is a schematic sectional plan view of a portion of an interface structure according to one embodiment, prior to forming a conductive structure.

FIG. 6B is a schematic sectional plan view of the interface structure of FIG. 6A, after forming the conductive structure.

FIG. 13A is a schematic side sectional view of a portion of a bonded structure, according to one embodiment.

DETAILED DESCRIPTION

Various embodiments disclosed herein relate to elements (e.g., semiconductor elements) with a conductive interface feature and a nonconductive feature. Various embodiments disclosed herein relate to interface structures that connect two elements in a manner that effectively seals a component (e.g., an integrated device) of the elements from the outside environs. For example, in some embodiments, an element can comprise a conductive interface feature (e.g., a copper, or Cu, layer) and a nonconductive interface feature (e.g., a silicon oxide layer). In some embodiments, the conductive interface feature can comprise a plurality of conductive pads. In some embodiments, the conductive interface feature can comprise a laterally elongate conductive feature. For example, in some embodiments, a bonded structure can comprise a plurality of elements bonded to one another along an interface structure. An integrated device can be coupled to or formed with a semiconductor element. For example, in some embodiments, the bonded structure can comprise a microelectromechanical systems (MEMS) device in which a cap (a first element) is bonded to a carrier (a second element). A MEMS element (the integrated device) can be disposed in a cavity defined at least in part by the cap and the carrier. The carrier can comprise an integrated device die (e.g., a processor die with active circuitry) in some embodiments. In other embodiments, the carrier can comprise a substrate (e.g., a semiconductor substrate), an interposer, etc.

In some embodiments, the conductive interface feature of the semiconductor element can comprise a recess, and a portion of the nonconductive interface feature can be disposed in the recess. In some embodiments, the recess in the conductive interface feature may prevent and/or mitigate hillock formation when the semiconductor element is annealed.

In some arrangements, the interface structure can comprise one or more conductive interface features disposed about the integrated device, and one or more non-conductive interface features to connect the first and second elements and to define an effectively annular or effectively closed profile. In some embodiments, the interface structure can comprise a first conductive interface feature, a second conductive interface feature, and a solid state non-conductive interface feature disposed between the first and second conductive interface features. In some embodiments, each element can comprise an associated conductive interface feature, and the conductive interface features can be directly bonded to one another to connect the two semiconductor elements.

Figure 1A:
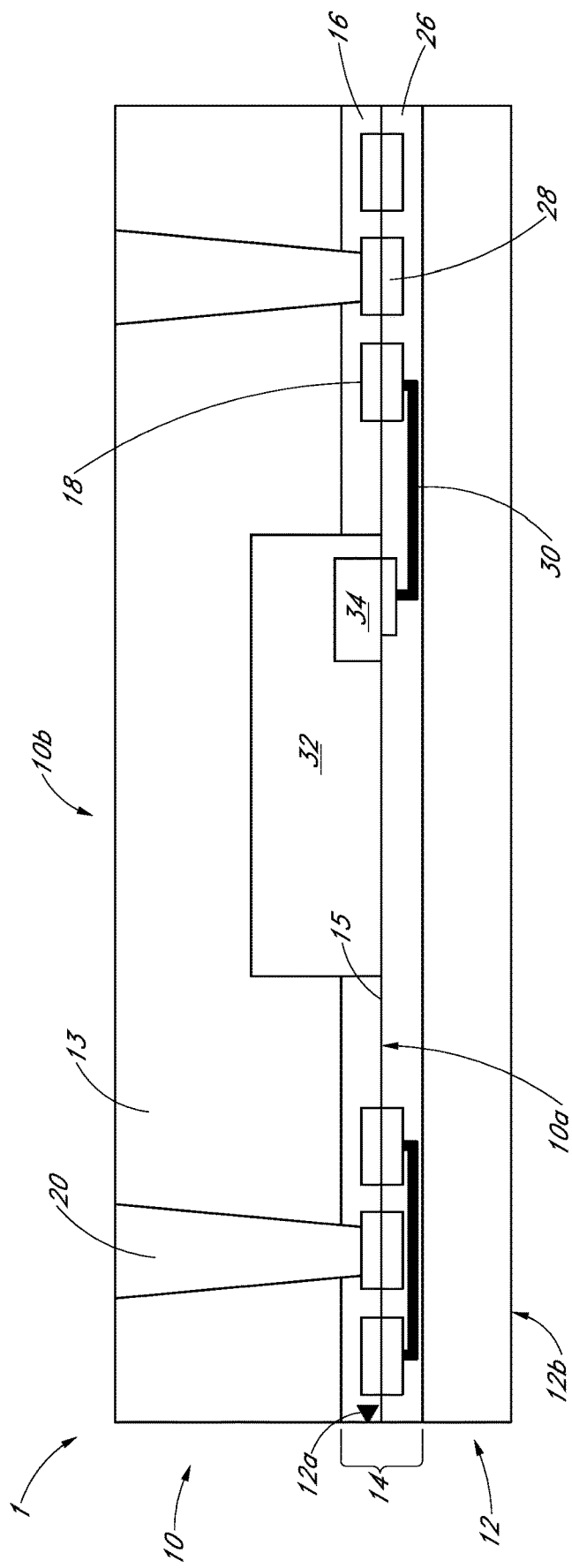
FIG. 1A is a schematic side sectional view of a bonded structure, according to one embodiment.

FIG. 1A is a schematic side sectional view of a bonded structure 1, according to one embodiment. The bonded structure 1 can include a first element 10 bonded to a second element 12 along an interface structure 14. In the illustrated embodiment, the first and second elements 10, 12 are directly bonded to one another without an intervening adhesive. The first element 10 can include a nonconductive field region 16 and a plurality of conductive contact pads 18 at a front side 10a. The nonconductive field region 16 can form part of a bonding layer for the bonded structure 1. In various embodiments, the nonconductive field region 16 can comprise an inorganic dielectric material, such as silicon oxide, silicon nitride, silicon oxynitride, silicon carbonitride, etc. The conductive contact pads 18 can comprise any suitable metal or conductor, e.g., copper, etc. Some or all of the contact pads 18 can be configured to provide electrical communication between one or more electronic components of the bonded structure 1 and an external device (e.g., a system board). The first element 10 can also include a conductive structure 20. The conductive structure 20 can comprise any suitable type of metal or conductor, such as copper, tungsten, poly-silicon, etc. In some embodiments, the conductive structure 20 can comprise an alloy. Although only one material is shown in FIG. 1A for the conductive structure 20, the conductive structure 20 may comprise one or more materials or one or more layers of conductive materials. The conductive structure 20 can extend from a back side 10b of the first element 10 to the interface structure 14 or beyond the interface structure 14 terminating into the second element 12. In the embodiment of FIG. 1A, the conductive structure 20 can extend through a bulk region 13 (e.g., a bulk semiconductor region, such as silicon, III-V materials, polysilicon or glass, sapphire, quartz, etc.) and can contact and terminate at contacts 18 at the front side 10a of the first element 10. As shown, the conductive structure 20 can contact a back side of the contact pads 18. As shown in various plan views illustrated herein (such as FIG. 2B), the conductive structure 20 can comprise a laterally-elongate structure that is disposed around an interior region of the bonded structure 1. The conductive structure 20 can define an effectively closed profile to seal the interior region from the outside environs.

The second element 12 can include a nonconductive field region 26 and a plurality of conductive pads 28 at a front side 12a. The nonconductive field region 26 can form part of a bonding layer for the bonded structure 1. In various embodiments, the nonconductive field region 26 can comprise an inorganic dielectric material, such as silicon oxide, silicon nitride, silicon oxynitride, silicon carbonitride, etc. The conductive contact pads 28 can comprise any suitable metal or conductor, e.g., copper, etc. Some or all of the contact pads 28 can be configured to provide electrical communication between one or more electronic components of the bonded structure 1 and/or an external device (e.g., a system board). The second element 12 can include an interconnect 30 formed in the nonconductive field region 26. The interconnect 30 can comprise a lateral conductive trace to electrically connect bonded contact pads 18, 28 to a contact pad that is electrically connected to an integrated device 34. The first element 10 and the second element 12 can define a cavity 32. The bonded structure 1 can include the integrated device 34, which can be disposed in the cavity 32. The integrated device 34 can comprise any suitable type of device, such as a microelectromechanical systems (MEMS) device, RF device, an electronic device (such as an active electronic device with active circuitry, a passive electronic device, etc.), an optical devices (such as a sensor, emitter, etc.), or any other suitable type of device.

In the illustrated embodiment, the first element 10 can comprise a cap that is shaped to define the cavity 32, or that is disposed over a cavity (not shown) in the second element 12. For example, in the illustrated embodiment, the cavity 32 can be etched into the first element 10. In some embodiments, the second element 12 can comprise a cap that is shaped to define a cavity. The cavity 32 can comprise an air cavity, can be under vacuum, or can be filled with a suitable filler material (such as a gel, molding compound, etc.). The first and second elements 10, 12 can comprise any other suitable type of element, which may or may not comprise a semiconductor material. For example, the elements 10, 12 can comprise various types of optical devices in some embodiments that may not comprise a semiconductor material.

In the illustrated embodiment, the first element 10 and/or the second element 12 can comprise a semiconductor element formed from one or more semiconductor materials. In some embodiments, the second element 12 can comprise a carrier having the front side 12a to which the first element 10 is bonded. In some embodiments, the carrier can comprise a substrate, such as a semiconductor substrate (e.g., a silicon interposer with conductive interconnects), a printed circuit board (PCB), a ceramic substrate, a glass substrate, or any other suitable carrier. In such embodiments, the carrier can transfer signals between the integrated device 34 and a larger packaging structure or electronic system. In some embodiments, the second element 12 can comprise an integrated device die with active circuitry, such as a processor die configured to process signals transduced by the integrated device 34. The integrated device 34 can comprise a MEMS element, such as a MEMS switch, an accelerometer, a gyroscope, etc. The integrated device 34 can be coupled to or formed with the first semiconductor element 10 or the second semiconductor element 12. In some embodiments, active circuitry can additionally or alternatively be formed in the first element 10.

In some configurations, it can be important to isolate or separate the integrated device die 34 from the outside environs, e.g., from exposure to liquid, gases and/or contaminants. For example, for some integrated devices, exposure to unwanted materials such as moisture or gases (such as hydrogen, oxygen gas, oxides of sulfur or nitrogen or various combinations thereof, etc.) can damage the integrated device 34 or other components of the structure 1. Accordingly, it can be important to provide an interface structure 14 that effectively or substantially seals (e.g., hermetically or near-hermetically seals) the cavity 32 and the integrated device 34 from unwanted materials. The interface structure 14 can be arranged to prevent and/or substantially suppress unwanted materials from passing through the interface structure 14 from outside environs of the structure 1 to an interior (e.g., the cavity 32) of the structure 1. For example, in various embodiments disclosed herein, the conductive structure 20 can extend through the first element 10 to the interface structure 14 or through the interface structure 14 into the second element 12 to substantially seal the interior of the bonded structure 1 (e.g., the cavity 34 and devices formed therein or thereon) from the outside environs.

The disclosed embodiments can utilize materials that have low gas permeation rates and can arrange the materials so as to reduce or eliminate the entry of gases into the cavity 32. In other embodiments, the cavity 32 can be filled with a different material, for example nitrogen, to maintain certain pressure for an improved performance of the device 34. In some embodiments, the permeation of this filler gas from inside the cavity 32 to outside the cavity 32 may be beneficial to maintain the pressure for the sustained performance of device 34 over the life of the product. For example, the permeation rate of some gases (such as hydrogen gas) through metals may be significantly less that the permeation rate of gases through other materials (such as dielectric materials or polymers). Hydrogen gas, for example, may dissociate into its component atoms at or near an outer surface of the structure 1. The dissociated atoms may diffuse through the material of the elements 10, 12 or the interface structure 14 and recombine at or near the interior (e.g., cavity 32) of the structure 1. The diffusion rate of hydrogen gas through metal can be approximately proportional to the square root of the pressure. Other gases, such as rare gases, may not permeate metals at all. By way of comparison, gases may pass through polymer or glass (silicon oxide) materials faster (e.g., proportional to the pressure) since the gas molecules may pass through without dissociating into atoms at the outer surface of the structure 1.

Accordingly, the embodiments disclosed herein can beneficially employ a material such as a metal for the conductive structure 20 that defines an effectively annular or closed pattern about the integrated device 34 to seal an interior region (e.g., cavity 32) of the bonded structure from the outside environs and harmful gases. In some embodiments, the effectively annular or closed conductive pattern can comprise a completely closed loop around the integrated device 34, which may improve sealing relative to other arrangements. In some embodiments, the effectively annular or closed conductive pattern can comprise an incompletely annular pattern, e.g., mostly or partially annular, about the device 34, such that there may be one or more gaps in the metal. Since the permeation rate of gases through metals (such as copper) is significantly less than the permeation rate of gases through dielectric or non-conductive materials (such as silicon oxide, silicon nitride, etc.), the interface structure 14 with conductive structure 20 can provide an improved seal for an interior region of the bonded structure 1.

However, in some embodiments, it may be undesirable to utilize an interface structure 14 that includes only metal or a significant width of metal lines. When the interface structure 14 includes wide metal lines or patterns, the planarization process of the metal lines and the surrounding dielectric suitable for robust direct bonding can be challenging, and can create issues including significant dishing, dielectric rounding, inconsistent bonding surface profile, etc. during chemical mechanical polishing (CMP) or other processing steps. Dishing of the metal lines can adversely affect the ability to bond the metal lines of the first element 10 to the second element 12, particularly when employing direct metal-to-metal bonding techniques. A relatively large dielectric area near the metal lines may reduce a bond line width or interfere with the direct bonding of the neighboring pads. Accordingly, in various embodiments, the interface structure 14 can include one or more conductive interface features embedded with or otherwise adjacent to one or more non-conductive interface features. The conductive interface features can provide an effective barrier so as to prevent or reduce the permeation of unwanted materials into the cavity 32 and/or to the integrated device 34 and/or to prevent or reduce the permeation of wanted gases filled in the cavity 32 to the outside environs. Moreover, the conductive interface features can be made sufficiently thin and can be interspersed or embedded with the non-conductive interface features so as to reduce or eliminate the deleterious effects of dishing.

In some embodiments disclosed herein, the interface structure 14 can be at least partially defined by the nonconductive field region 16 and the plurality of conductive pads 18 at the front side 10a of the first element 10 and by the nonconductive field region 26 and the plurality of conductive pads 28 at the front side 12a of the second element 12. In some embodiments, the interface structure 14 can include at least a portion of the conductive structure 20, for example, a portion of the conductive structure 20 that extends through the nonconductive field region 16 and/or that contacts the pads 18 in the first element 10. In some embodiments, the nonconductive field region 16 and the plurality of conductive pads 18 at the front side 10a can be respectively bonded to the corresponding nonconductive field region 26 and the corresponding plurality of conductive pads 28 at the front side 12a. For example, the nonconductive field region 16 can be directly bonded to the corresponding nonconductive field region 26 without an adhesive along a bonding interface 15. The contact pads 18 can also be directly bonded to the contact pads 28 without an adhesive along the bonding interface 15.

The interface structure 14 may provide mechanical and/or electrical connection between the first and second elements 10, 12. In some embodiments, the interface structure 14 may provide only a mechanical connection between the elements 10, 12, which can act to seal the cavity 32 and/or the integrated device 34 from the outside environs. In other embodiments, the interface structure 14 may also provide an electrical connection between the elements 10, 12 for, e.g., grounding and/or for the transmission of electrical signals. For example, electrical connections can be provided between directly bonded pairs of the contact pads 18, 28. In other embodiments, the interface structure 14 may provide an optical connection between the elements 10, 12.

Bonding surfaces (e.g., the front side 10a of the first element 10 and the front side 12a of the second element 12) can be polished or planarized, activated, and terminated with a suitable species. For example, in various embodiments, one or both the nonconductive field regions 16, 26 may comprise an inorganic dielectric material, for example, silicon oxide. The bonding surfaces can be polished to a root-mean-square (rms) surface roughness of less than 2 nm, e.g., less than 1 nm, less than 0.5 nm, etc. The polished bonding surfaces can be activated by for example, a process comprising atmospheric or a vacuum plasma method. In various embodiments, the bonding surfaces can be terminated with nitrogen, for example, by way of wet or dry etching (e.g., very slight etching (VSE)) using, for example, a nitrogen-containing solution or by using a plasma etch with nitrogen. As explained herein, the nonconductive field regions 16, 26 of the bonding surfaces can be brought into contact to form a direct bond at room temperature without application of external pressure and without an adhesive. In some embodiments, the elements 10, 12 can be heated further to improve the bond strength between the opposing bonding surfaces of elements 10, 12, and to form reliable electrical and mechanical contact at the interface between the elements 10, 12. For example, in some embodiments, the respective contact pads 18, 28 can be flush with the surface of the respective nonconductive field regions 16, 26, or can be recessed below the nonconductive field regions 16, 26, for example, recessed in a range of 0 nm to 20 nm, or in a range of 4 nm to 10 nm. The nonconductive field regions 16, 26 can be directly bonded to one another without an adhesive at room temperature and, subsequently, the bonded structure 1 can be annealed. Upon annealing, the contact pads 18, 28 can expand and contact one another to form a metal-to-metal direct bond. The metal-to-metal direct bonds can provide an electrical and a mechanical connection between the two elements 10, 12. Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; 7,485,968; 8,735,219; 9,385,024; 9,391,143; 9,431,368; 9,953,941; 9,716,033; 9,852,988; 10,032,068; 10,434,749; and 10,446,532, the contents of each of which are hereby incorporated by reference herein in their entirety and for all purposes.

Any suitable type of integrated device or structure can be used in conjunction with the disclosed embodiments. For example, in some embodiments, the first and second elements 10, 12 can comprise integrated device dies, e.g., processor dies, memory dies, and/or radio frequency (RF) or optical devices. In addition, although the disclosed embodiment includes the cavity 32, in other arrangements, there may not be a cavity. Rather, the interior of the bonded structure 1 can alternatively include sensitive circuitry or devices without a cavity that can be sealed or protected by the conductive structure 20 and directly bonded contact pads 18, 28. For example, the embodiments disclosed herein can be utilized with any suitable integrated device or integrated device die in which it may be desirable to seal active components from the outside environs, gases, liquids, plasma or unwanted materials. Moreover, the disclosed embodiments can be used to accomplish other objectives. For example, in some arrangements, the disclosed interface structure 14 can be used to provide an electromagnetic shield or Faraday cage to reduce or prevent unwanted electromagnetic radiation from entering the structure 1, and/or to prevent various types of signal leakage. Of course, the cavity may be filled with any suitable fluid, such as a liquid, gas, or other suitable substance which may improve the thermal, electrical or mechanical characteristics of the structure 1.

In some embodiments, the conductive structure 20 can comprise a through via (e.g., through substrate via (TSV)). In some embodiments, the TSV can comprise a filled via or a conformal via. In the illustrated embodiment, the conductive structure 20 can comprise a filled via in which a conductive material (such as a metal like copper) that can fill a channel or trench formed in the first element 10. The filled via can comprise a layered filled via in which a conductive filler comprises multiple conductive layers deposited over a barrier or seed layer. The layers of conductive filler can have different widths. In other embodiments, the conductive structure 20 can comprise a conformally-filled via in which a conductive layer conformally coats an interior of a channel or trench formed in the first element 10 but that may not fill the channel or trench.

FIGS. 1B to 1E illustrate a process flow of manufacturing the bonded structure 1 illustrated in FIG. 1A. In FIG. 1B, the first element 10 and the second element 12 can be provided. The first element 10 can comprise the nonconductive field region 16 and the plurality of conductive pads 18 at the front side 10a. The second element 12 can comprise the nonconductive field region 26 and the plurality of conductive pads 28 at the front side 12a. The second element 12 can include an interconnect 30 formed in the nonconductive field region 26. The integrated device 34 can be disposed on the front side 12a of the second element 12. The integrated device 34 can be mechanically and/or electrically coupled to the second element 12, for example, by way of the interconnect 30.

The front sides 10a, 12a of the first and second elements 10, 12 can be respectively prepared for bonding. For example, as explained above, the front side 10a of the first element 10 and the front side 12a of the second element 12 can be polished or planarized, activated, and terminated with a suitable species. The polished bonding surfaces can be activated by for example, a process comprising atmospheric or a vacuum plasma method. In various embodiments, the bonding surfaces of the nonconductive field regions 16, 26 can be terminated with nitrogen, for example, by way of wet or dry etching using, for example, a nitrogen-containing solution or by using a plasma etch with nitrogen. In some embodiments, the respective contact pads 18, 28 can be flush with the surface of the respective nonconductive field regions 16, 26, or can be recessed below the nonconductive field regions 16, 26, for example, recessed in a range of 1 nm to 20 nm, or in a range of 4 nm to 10 nm.

In FIG. 1C, the first element 10 and the second element 12 are brought into contact at room temperature without application of external pressure and without an adhesive to form a direct dielectric bond along the bonding interface 15. The nonconductive field regions 16, 26 can be directly bonded to one another without an adhesive at room temperature and, subsequently, the bonded structure 1 can be annealed. Upon annealing, the contact pads 18, 28 can expand and contact one another to form a metal-to-metal direct bond without an adhesive along the bonding interface 15. The conductive bond between the contact pads 18, 28 can provide a mechanical connection as well as an electrical connection between the elements 10, 12 in various embodiments. Thus, in the illustrated embodiment, the nonconductive field region 16 and the plurality of conductive pads 18 of the first element 10 can be respectively directly bonded to the corresponding nonconductive field region 26 and the corresponding plurality of conductive pads 28 of the second element 12. In some embodiments, the first element 10 can directly contact the second element 12 without an intervening adhesive. The first element 10 and the second element 12 can define the cavity 32.

In some embodiments, a number of the plurality of conductive pads 18 of the first element 10 and a number of the plurality of conductive pads 28 of the second element 12 can be the same. In some embodiments, the number of the plurality of conductive pads 18 and the number of the plurality of conductive pads 28 can be different. In such embodiments, one pad of an element can be bonded to two or more of pads of the other element. Although FIG. 1A illustrates each contact pad 18 of the first element 10 are directly connected to a corresponding one of the contact pads 28 of the second element 12, in some embodiments, one or more contact pads 28, 18 of one element may not have a respective contact pad 18, 28 of the other element. In some embodiments, a number of the contact pads 18 can be the same as a number of the contact pads 28. In some other embodiments, the number of the contact pads 18 can be more or less than the number of contact pads 28. In some embodiments, one of the contact pad 18 can be in contact with two or more contact pads 28. In some embodiments, the bonded nonconductive field regions 16, 26 and the bonded conductive pads 18, 28 can at least partially define the interface structure 14. In the illustrated embodiment, there are a plurality (e.g., three) rows or rings R1, R2, R3 of conductive pads around the cavity 32 (see also FIG. 2A). However, there can be any number of row(s) or rings of conductive pads, in various embodiments. Having a plurality of pads, instead of an elongate conductive structure for direct bonding can be beneficial, in some applications. For example, in some applications, having a plurality of conduct pads can mitigate or eliminate issues associated with having a single long conductive structure, such as dishing, rounding, and/or non-uniform metal loading during a manufacturing process. In other embodiments, when the first element 10 and the second element 12 are brought into contact, the nonconductive field region 16 and the nonconductive field region 26 can be bonded while the plurality of conductive pads 18 may not bond with the plurality of conductive pads 28.

In FIG. 1D, a trench or channel 36 can be formed in the first element 10. The channel 36 can extend from the back side 10b of the element 10 to the interface structure 14. The channel 36 as illustrated in FIG. 1D extends from the back side 10b of the element 10 to a middle row R2 of the three rows of contact pads around the cavity 32. However, the channel 36 can extend to any one(s) of the plurality of conductive pads. The channel 36 can be formed in any suitable manner. In some embodiments, the channel 36 can be formed by way of drilling (e.g., laser drilling), or etching (e.g., wet etching or dry etching). In some embodiments, the contact pads 18 in the middle ring R2 can serve as an etch stop when forming the channel 36. In some embodiments, in the absence of the pad 18 in ring R2 of first element 10, the contact pad 28 in the middle ring R2 can serve as an etch stop when forming the channel 36. In some embodiments, channel 36 can be formed at the edge of the interface structure 14. In some other embodiments, the channel 36 can extend though the interface structure and into the element 12.

In FIG. 1E, the conductive structure 20 can be provided in the channel 36. In some embodiments, as shown in FIG. 2B, for example, the conductive structure 20 can extend around the cavity 32 and/or the integrated device 34 in an effectively closed or annular pattern. For example, the conductive structure 20 can extend in a complete annulus, or closed shape, about the cavity 32 and/or the device 34. In other arrangements, the conductive structure 20 can extend around substantially the entire periphery of the cavity 32, but may include one or more gaps. In some embodiments, the conductive structure 20 and the plurality of pads 18, 28 can comprise the same or similar materials. In some embodiments, the conductive structure 20 can comprise noble metals. In some embodiments, the conductive structure 20 and/or the plurality of pads 18, 28 can comprise any suitable conductor, such as copper, gold, tungsten, titanium, tin, nickel, silicon nitride, etc. The illustrated process of forming the conductive structure 20 can be referred to as a via last process in which the conductive structure 20 is formed after the first element 10 and the second element 12 are bonded. In some embodiments, one or more layers of conductive and/or non-conductive materials can be provided in the channel 36. For example, after channel 36 is formed, a barrier layer can be formed on a sidewall of the channel 36. In some embodiments, the barrier layer can comprise silicon oxide, silicon nitride, etc. An adhesive layer can be formed on the barrier layer. In some embodiments, the adhesive layer can comprise titanium nitride (TiN), titanium (Ti), tantalum nitride (TaN), and/or tritium (T). Another conductive material (e.g. Cu) can be provided on the adhesive layer.

Figure 2A:
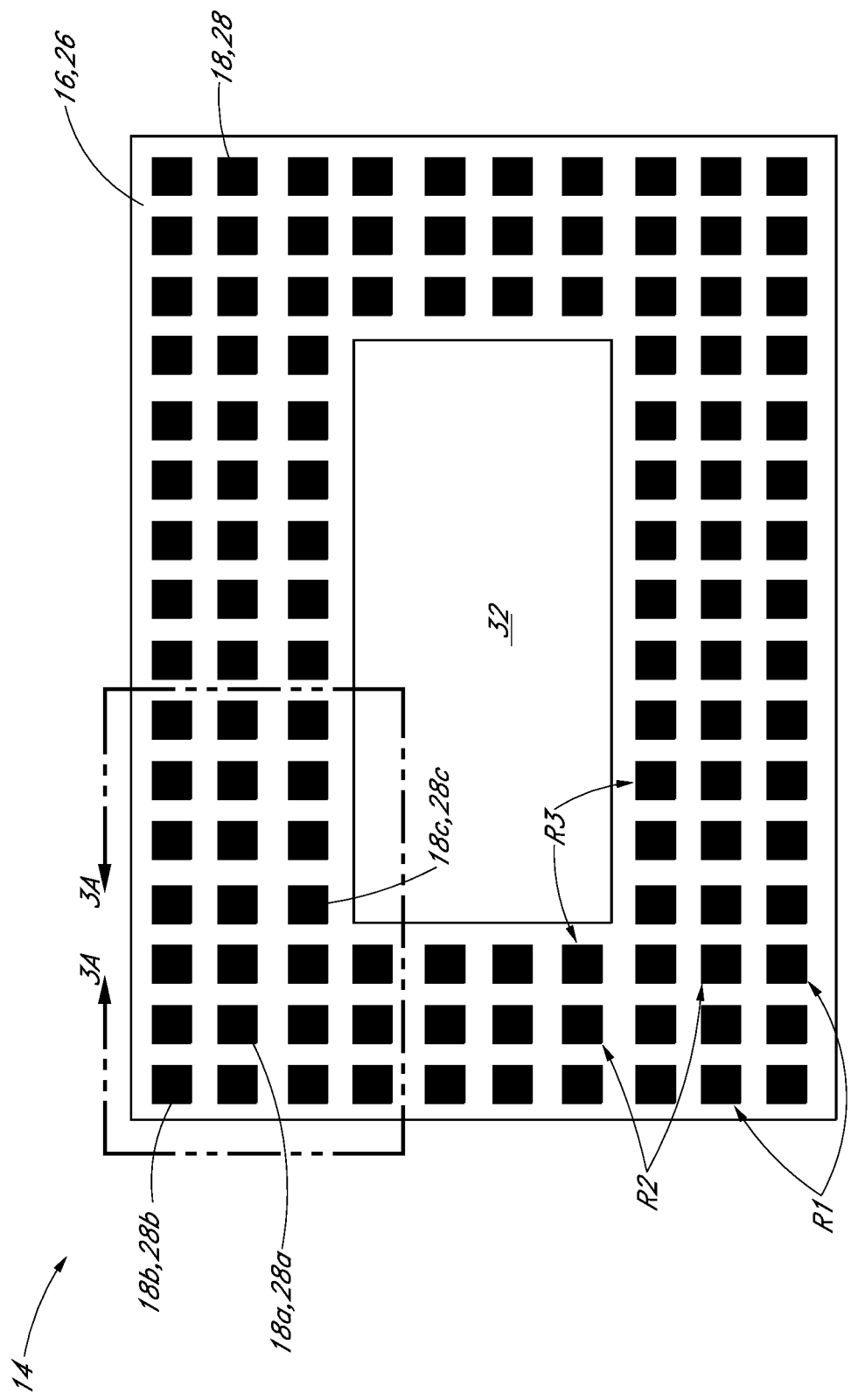
FIG. 2A is a schematic sectional plan view of an interface structure according to one embodiment, prior to forming a conductive structure.
Figure 2C:
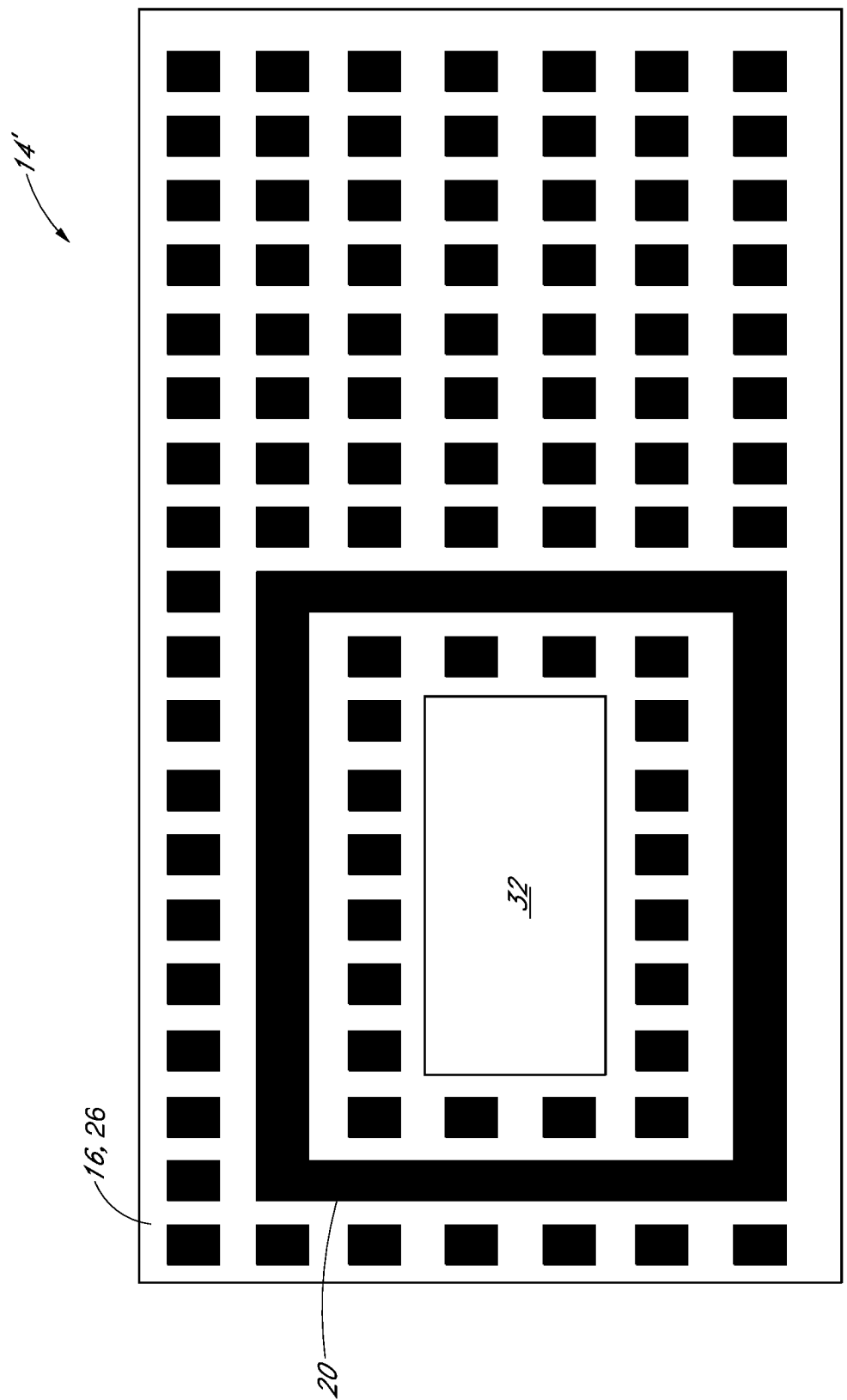
FIG. 2C is a schematic sectional plan view of an interface structure after forming a conductive structure, according to one embodiment.

FIG. 2A is a schematic sectional plan view of the interface structure 14 according to one embodiment, after directly bonding but prior to forming the conductive structure 20. FIG. 2B is a schematic sectional plan view of the interface structure 14 of FIG. 2A, after forming the conductive structure 20 through the first element 10. FIG. 2C is a schematic sectional plan view of an interface structure 14' according to another embodiment. FIG. 3A is an enlarged view of a corner of the interface structure 14 illustrated in FIG. 2A. FIG. 3B is an enlarged view of a corner of the interface structure 14 illustrated in FIG. 2B. Although FIG. 2B depicts perfect alignment of pads 18 and 28, they may be offset from one another when bonding.

The interface structure 14 can comprises the bonded nonconductive field region 16, 26 and of the bonded conductive pads 18, 28. In some embodiments, as illustrated, the plurality of conductive pads 18, 28 can comprise three rings R1, R2, R3 of conductive pads that can include center pads 18a, 28a, outer pads 18b, 28b and inner pads 18c, 28c. The inner pads 18c, 28c are positioned closer to an interior of the bonded structure 1 (e.g., closer to the cavity 32) than the center pads 18a, 28a and the outer pads 18b, 28b. The center pads 18a, 28a are positioned between the outer pads 18b, 28b and the inner pads 18c, 28c. The interface structure 14 can also include at least a portion of the conductive structure 20. The interface structure 14 can have any number of conductive pads 18, 28. The plurality of conductive pads 18, 28 as illustrated have equally sized rectangular (e.g., square) pads. However, in some embodiments, the plurality of conductive pads 18b, 28b can comprise any suitable sizes and shapes, and may include differently-shaped pads. For example, the pads can be polygonal pads or rounded (e.g., circular pads). In some embodiments, the pads in an interface structure can have differently sized pads. Thus, as shown in FIGS. 2A and 3A, prior to forming the conductive structure 20, the directly bonded pads 18, 28 can comprise an array of multiple bonded pads provided in one or more rings around the cavity 32.

As explained above, a conductive material can be provided in the channel 36 and can extend from the back side of the contact pads 18 to the back side 10b of the first element 10 to form the effectively closed conductive structure 20. In the illustrated embodiment, the conductive structure 20 extends from the back side 10b of the first element 10 (see FIG. 1E) to the contact pads 18a in the middle ring R2 of contact pads. As illustrated, the conductive structure 20 can extend around the cavity 32 in an effectively annular pattern that comprises completely annular pattern without significant gaps. However, in other embodiments, there may be one or more gaps between portions of the conductive structure 20, but without a direct pathway to the cavity 32.

Beneficially, the conductive structure 20 and the contact pads 18a, 28a can cooperate to define a substantially sealed ring around the interior of the bonded structure 1 (e.g., around the cavity 32) to inhibit liquids, gases, or contaminants from entering and/or leaving the cavity 32. In some embodiments, the conductive structure 20 can define the substantially sealed ring at or near the outer edge of the entirety of an interface structure like the interface structure 14. In some other embodiments, the conductive structure 20 can define the substantially sealed ring for a portion of an interface structure like the interface structure 14' as shown in FIG. 2C.

In FIG. 2C, the conductive structure 20 can define the substantially sealed ring around the cavity 32 defined at a portion of the interface structure 14'. Other portions of the interface structure 14' can be disposed outside the substantially sealed ring. In some embodiments, a majority of the interface structure 14' can be outside of the substantially sealed ring. In some other embodiments, a minority of the interface structure 14' can be outside of the substantially sealed ring. Although FIG. 2C depicts only one substantially sealed ring, another embodiment may 2 or more such sealed rings around 2 or more such cavities.

Moreover, providing the elongate conductive structure 20 after directly bonding the contact pads 18, 28 can avoid undesirable effects of dishing, which may arise if elongate conductive structures were directly bonded to one another to form the closed profile. In some embodiments, the conductive structure 20 and the bonded pads 18a, 28a may be electrically inactive, such that the conductive structure 20 and bonded pads 18a, 28a serve only to seal the interior of the bonded structure 1. In other embodiments, the conductive structure 20 can also electrically connect to the bonded pads 18a, 28a. For example, in some embodiments, the conductive structure 20 and bonded pads 18a, 28a can be connected to electrical ground. In other embodiments, the conductive structure 20 and bonded pads 18a, 28a can provide electrical power and/or can transfer electrical signals to and/or from devices in the bonded structure 1. Additional details of interface structures that can be used in conjunction with each of the disclosed embodiments may be found throughout U.S. Pat. Nos. 10,002,844, 10,522,499, and U.S. Publication 2019/0348336, the contents of each of which are hereby incorporated by reference herein in their entirety and for all purposes.

Figure 4:
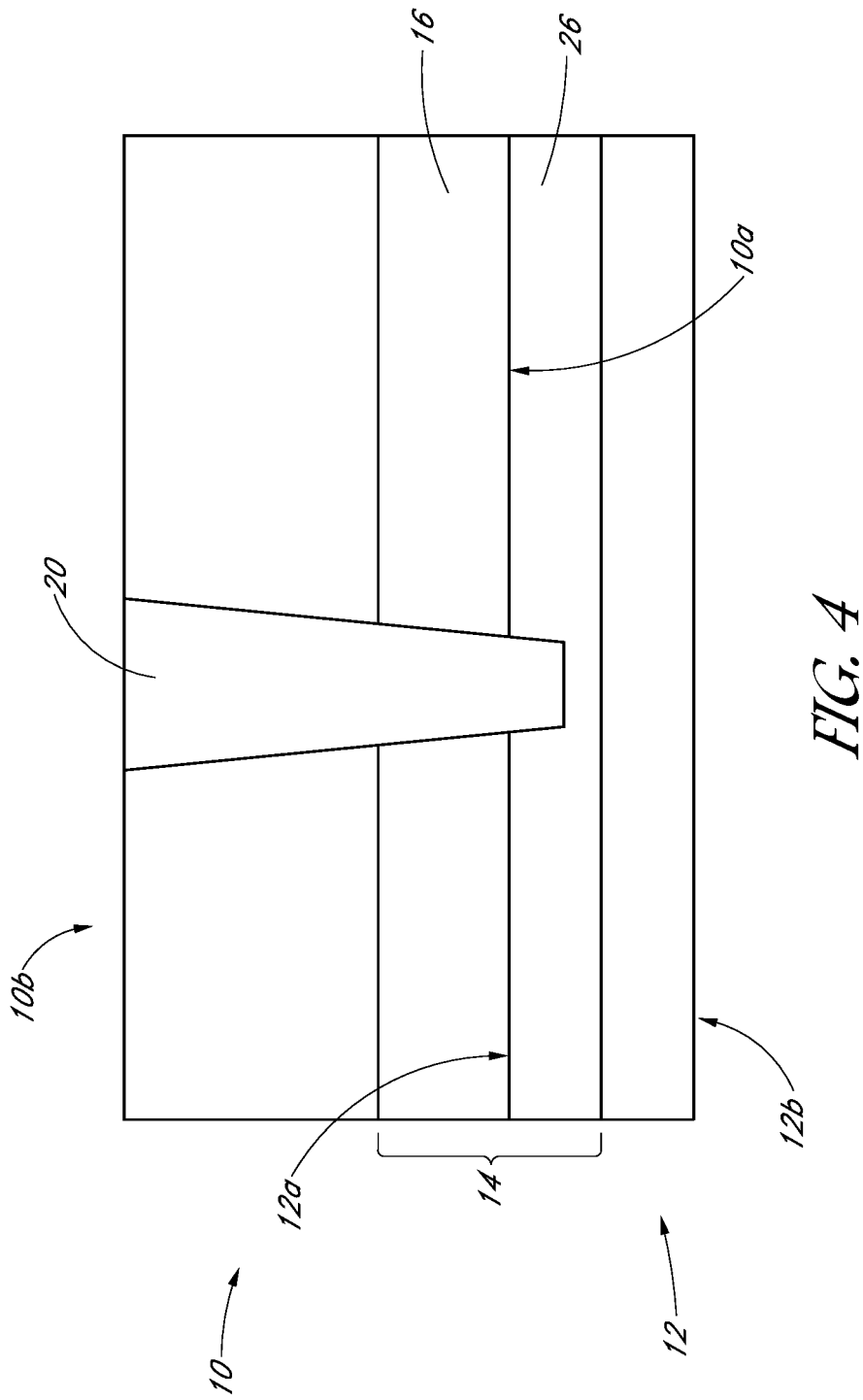
FIG. 4 is a schematic side sectional view of a portion of a bonded structure, according to one embodiment.

FIG. 4 is a schematic side sectional view of a portion of a bonded structure, according to one embodiment. The bonded structure can include the interface structure 14 of FIG. 3B. The cross section of the bonded structure can include a first element 10 bonded to a second element 12 along an interface structure 14. The first element 10 can include a nonconductive field region 16. The second element 12 can include a nonconductive field region 26. The cross section of the bonded structure can also include a conductive structure 20.

The conductive structure 20 can extend from a back side 10b of the first element 10 to the interface structure 14. As illustrated in FIG. 4, the conductive structure 20 can extend from the back side 10b of the first element 10 through the nonconductive field region 16 and a portion of the nonconductive field region 26. Therefore, in some embodiments, the conductive structure 20 can provide a metal seal to a gap the plurality of conductive pads 18, 28. In some embodiments, the conductive structure 20 can extend from the back side 10b of the first element 10 completely through the nonconductive field regions 16, 26. In some embodiments, the conductive structure 20 can extend from the back side 10b of the first element 10 completely through the first and second elements 10, 12 to a back side 12b of the second element 12.

Figure 5A:
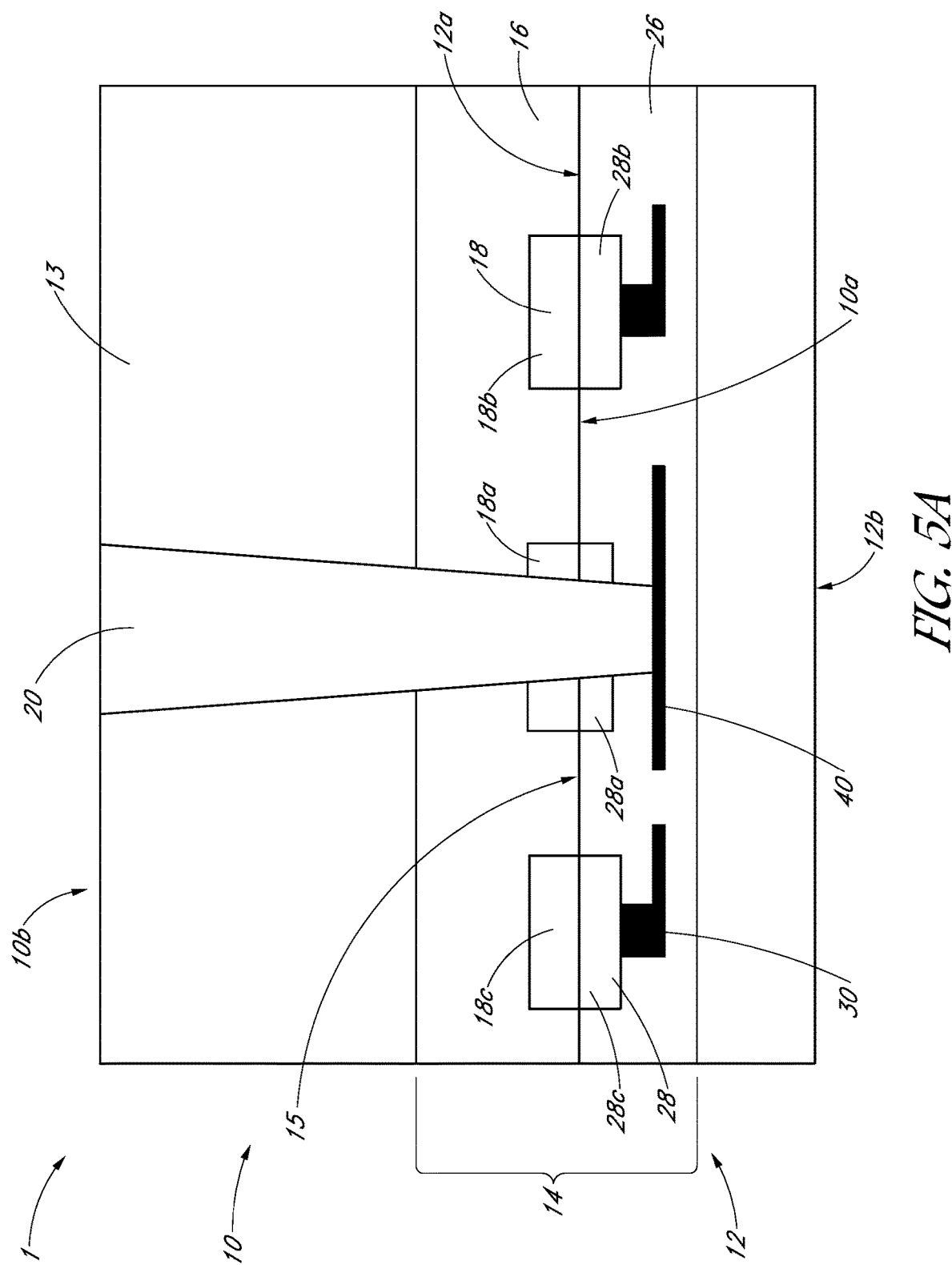
FIG. 5A is a schematic side sectional view of a portion of a bonded structure, according to another embodiment.
Figure 5B:
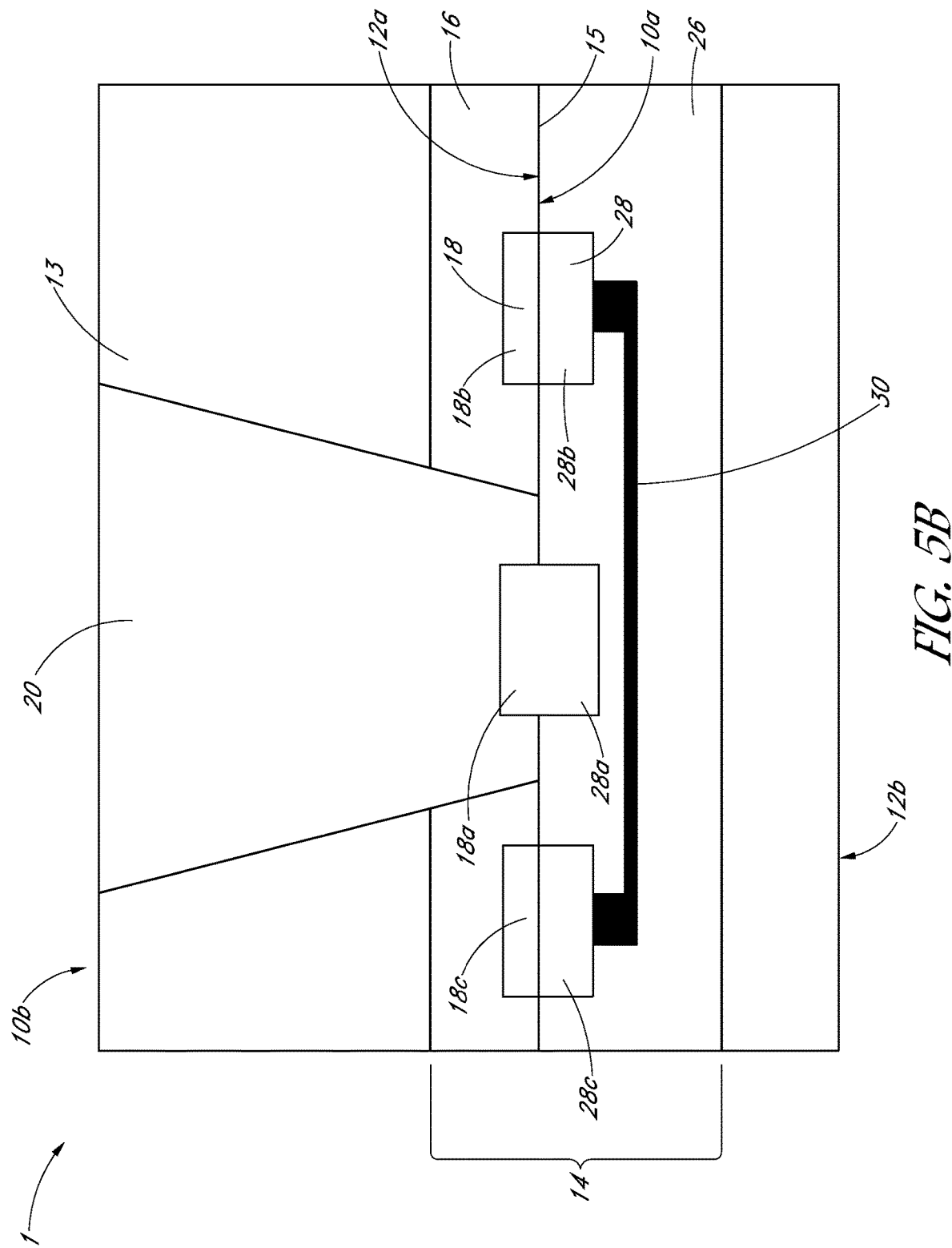
FIG. 5B is a schematic side sectional view of a portion of a bonded structure, according to another embodiment.
Figure 5C:
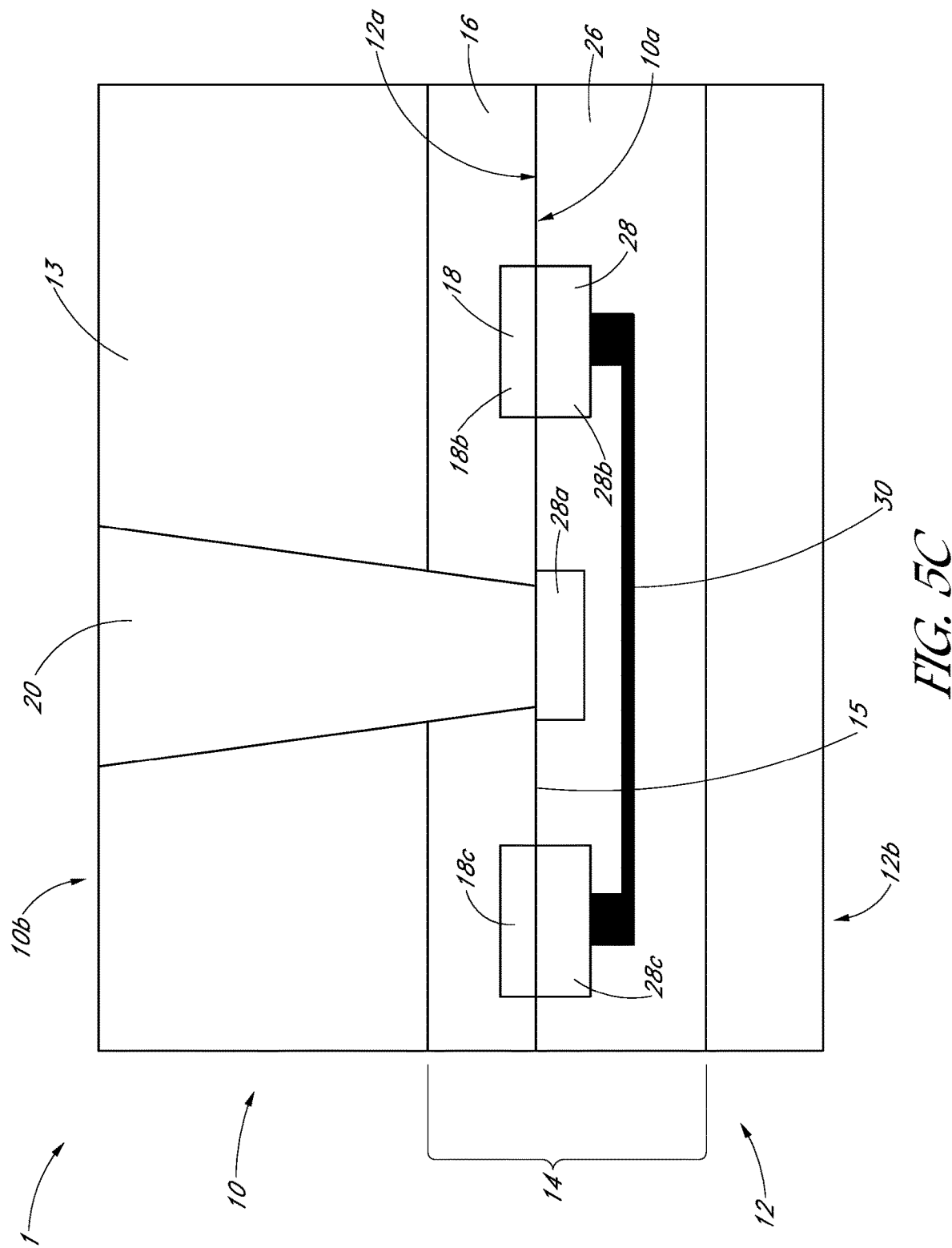
FIG. 5C is a schematic side sectional view of a portion of a bonded structure, according to another embodiment.

FIGS. 5A to 5C are schematic side sectional views of a portion of a bonded structure 1, according to various embodiments. Unless otherwise noted, the components of FIGS. 5A-5C may be the same as or generally similar to like-numbered components of FIGS. 1-4. The portion of the bonded structure 1 can include the interface structure 14 of FIG. 3B, e.g., the conductive structure 20 can mechanically and/or electrically connect to the middle row R2 of directly bonded contact pads 18a, 28a. The cross sections illustrated in FIGS. 5A to 5C can share similar components and features.

The cross sections of FIGS. 5A to 5C can include a first element 10 bonded to a second element 12 along an interface structure 14. The first element 10 can include a nonconductive field region 16 and a plurality of conductive pads 18. In some embodiments, the plurality of conductive pads 18 can include center pads 18a, outer pads 18b, and inner pads 18c. The second element 12 can include a nonconductive field region 26 and a plurality of conductive pads 28. In some embodiments, the plurality of conductive pads 28 can include center pads 28a, outer pads 28b, and inner pads 28c. In some embodiments, the cross section of the bonded structure can also include a conductive structure 20 and an interconnect 30 that can connect one of the conductive pads (e.g., the outer pad 28b) to another conductive pad (e.g., the inner pad 28c) and/or a component associated with the bonded structure 1. Each of the conductive structures 20 shown in FIGS. 5A-5C can define an effectively closed profile around the interior of the bonded structure 1, e.g., around the cavity 32, so as to provide an effective seal for the interior of the bonded structure 1.

The conductive structure 20 illustrated in FIG. 5A extends from the back side 10b of the first element 10 to the interface structure 14. For example, the conductive structure 20 extends through the bulk region 13, the nonconductive field region 16, a portion of the center pads 18a of the plurality of conductive pads 18 on the first element 10, a portion of the center pads 28a of the plurality of conductive pads 28 on the second element 12, and a portion of the nonconductive field region 26. The conductive structure 20 can terminate at and contact a lateral feature 40 formed in the second element 12. In some embodiments, the lateral feature 40 can comprise the interconnect 30, and can be electrically active. In other embodiments, the lateral feature 40 can be electrically inactive. The lateral feature 40 of FIG. 5A can be at least partially embedded in the nonconductive field region 26. In some embodiments, by having the conductive structure 20 extend through the center pads 18a, 28a across the bonding interface 25 between the first element 10 and the second element 12, a more reliable seal can be provided as compared to a conductive structure 20 that does not extend through the conductive pads 18, 28 across the bonding interface 15 between the elements 10, 12. In some embodiments, the conductive structure 20 can extend to the lateral feature 40 which may be an etch stop for forming a channel for the conductive structure 20. The etch stop can comprise, for example, silicon nitride. Although FIG. 5A shows the pads 18a, 28a as being wider than the conductive structure 20, in some embodiments, the pads 18a, 28a may be narrower than the conductive structure 20 and hence not visible in the final structure.

The lateral feature 40 can comprise any conductive or nonconductive materials. The lateral feature 40 can comprise a ring at least partially around the cavity 32 or the integrated device 34. In some embodiments, the lateral feature 40 can comprise a continuous line that defines a complete ring around the cavity 32. In some other embodiments, the lateral feature 40 can comprise a discontinuous ring around the cavity 32. In some embodiments, the lateral feature 40 can provide a lateral electrical connection within the structure 1.

The conductive structure 20 illustrated in FIG. 5B extends from the back side 10b of the first element 10 to the interface structure 14. For example, the conductive structure 20 extends through bulk region 13 and the nonconductive field region 16, and is disposed around and over the middle contact pad 18a. A portion of the conductive structure 20 can be disposed along at least one of the sidewalls of the center pads 18a of the plurality of conductive pads 18. Thus, in FIG. 5B, the effectively closed conductive structure 20 can extend to the bonding interface 15, sidewalls of the center pads 18a, the back side of the center pads 18a. The conductive structure 20 can be conformally deposited over the contact pads 18a in the channel 36. In some embodiments, the conductive structure 20 may extend beyond the bonding interface 15 into the nonconductive field region 26. In such embodiments, a portion of the conductive structure 20 can be disposed along a sidewall of the center pad 28a of the plurality of conductive pads 28. In some other embodiments, the conductive structure 20 may extend below the center pad 28a and into the nonconductive field region 26. The conductive structure 20 can contact a lateral feature (not shown) below the center pad 28a. Although FIG. 5B depicts the conductive structure 20 as being centered with the contact pad 18a, the conductive structure 20 can be offset relative to the contact pad 18a. In some other embodiments, the conductive structure 20 can be offset relative to the contact pad 18a such that the conductive structure 20 is only disposed around one or more side walls of contact pad 18a.

The cross section illustrated in FIG. 5C includes two conductive pads 18b, 18c on the first element 10 and three conductive pads 28a-28c on the second element 12. Thus, the portion of the bonded structure 1 in FIG. 5C may not include the middle row R2 of contact pads 18a. The conductive structure 20 illustrated in FIG. 5C extends from the back side 10b of the first element 10 through nonconductive field region 16 to the bonding interface 15 and the center pads 28a of the second element 12. In the illustrated embodiment, the conductive structure 20 terminates at and contacts the front side of the center contact pads 28a. In other embodiments, the conductive structure 20 can extend through a portion of a thickness of the center pads 28a of the conductive pads 28. In other embodiments, a portion of the conductive structure 20 can be disposed along at least portions of sidewalls of the center pad 28a of the plurality of conductive pads 28. In other embodiments, the conductive structure 20 can extend below the center pads 28a of the conductive pads 28 or may terminate on lateral feature 40 below the center pads 28a.

FIG. 6A is a schematic sectional plan view of a portion of an interface structure 14 according to one embodiment, after directly bonding but prior to forming a conductive structure 20. FIG. 6B is a schematic sectional plan view of the interface structure 14, after forming the conductive structure 20. The interface structure 14 illustrated in FIGS. 6A and 6B can comprise directly bonded nonconductive field region 16, 26 and a plurality of directly bonded conductive contact pads 18, 28. In some embodiments, the plurality of conductive pads can comprise two rows of conductive pads (e.g., an outer row and an inner row) that can include outer pads 18b, 28b and inner pads 18c, 28c. FIG. 6B illustrates the conductive structure 20 being disposed between the outer pads 18b, 28b and the inner pads 18c, 28c and extending through at least portions of the bonded field regions 16, 26. In FIGS. 6A and 6B, there may be no middle row of contact pads 18a, 28a.

Figure 7:
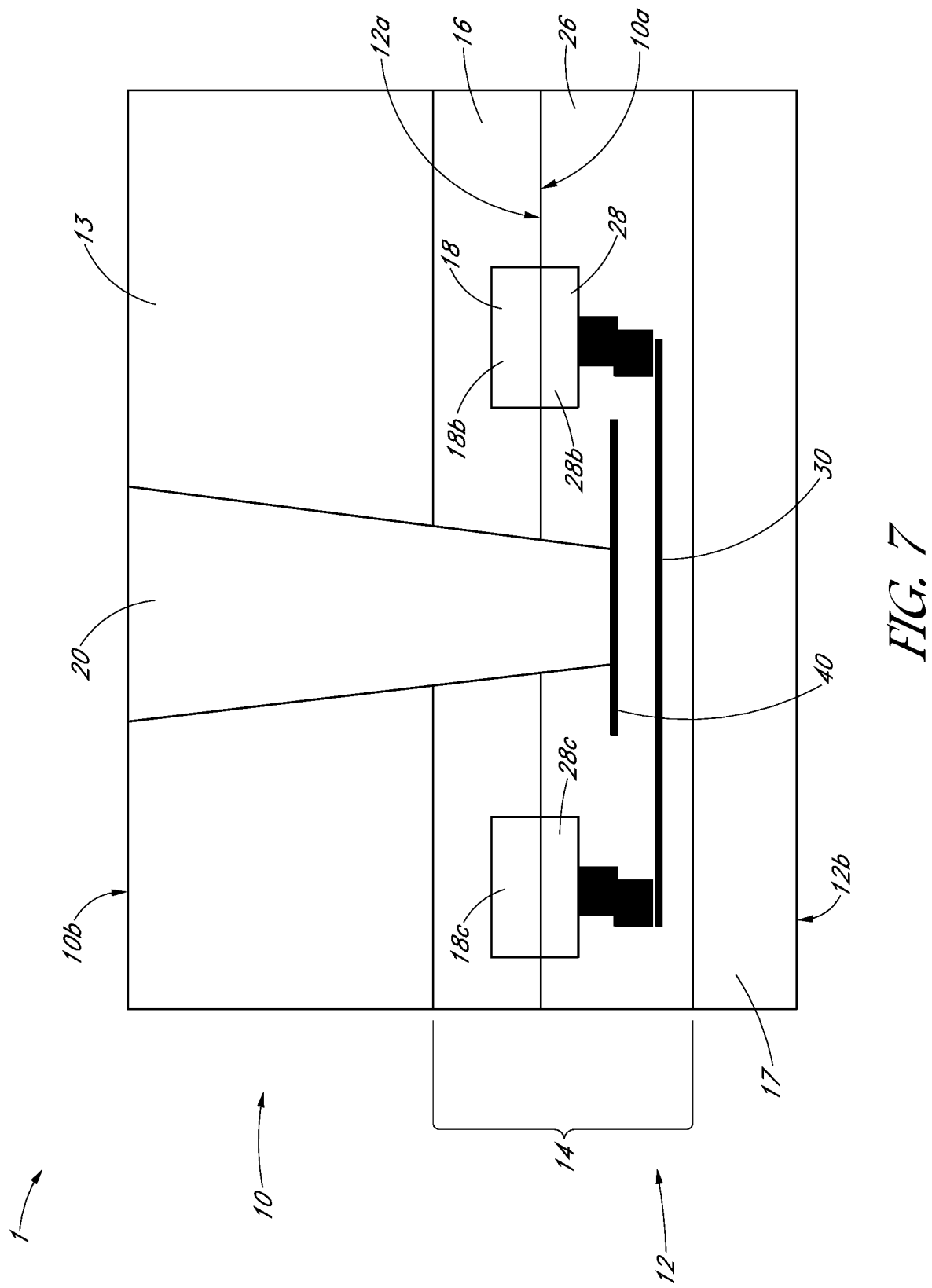
FIG. 7 is a schematic side sectional view of a portion of a bonded structure, according to one embodiment.

FIG. 7 is a schematic side sectional view of a portion of a bonded structure 1, according to one embodiment. The bonded structure can include the interface structure 14 of FIG. 6B, in which there may be only outer and inner rings of contact pads. The cross section of the bonded structure 1 can include a first element 10 bonded to a second element 12 along the interface structure 14. The first element 10 can include a nonconductive field region 16 and a plurality of conductive pads 18. The plurality of conductive pads 18 can include outer pads 18b and inner pads 18c. The second element 12 can include a nonconductive field region 26 and a plurality of conductive pads 28. The plurality conductive pads 28 can include outer pads 28b and inner pads 28c. The cross section of the bonded structure can also include a conductive structure 20 between the outer pads 18b, 28b and the inner pads 18c, 28c.

The conductive structure 20 can extend from a back side 10b of the first element 10 to the interface structure 14. As illustrated in FIG. 7, the conductive structure 20 can extend from the back side 10b of the first element 10 through the bulk region 13, the nonconductive field region 16, and a portion of the nonconductive field region 26 to terminate at and contact a lateral feature 40 formed in the second element 12. In the illustrated embodiment, the lateral feature 40 is at least partially embedded (e.g., completely embedded or buried) in the nonconductive field region 26 of the second element. Beneficially, the conductive structure 20 can provide a conductive seal in a gap between the bonded outer pads 18b, 28b and the bonded inner pads 18c, 28c. In other embodiments, the lateral feature 40 can be disposed at least partially in a bulk region 17 of the second element 12, in which case the conductive structure 20 can extend from the back side 10b of the first element 10 completely through the nonconductive field regions 16, 26. In other embodiments, the conductive structure 20 can extend from the back side 10b of the first element 10 completely through the first and second elements 10, 12 to a back side 12b of the second element 12. As explained above, in some embodiments, the lateral feature 40 can be electrically inactive, and the interconnect 30 can be routed around the lateral feature 40. In other embodiments, the lateral feature 40 can be electrically active as explained above.

Figure 8B:
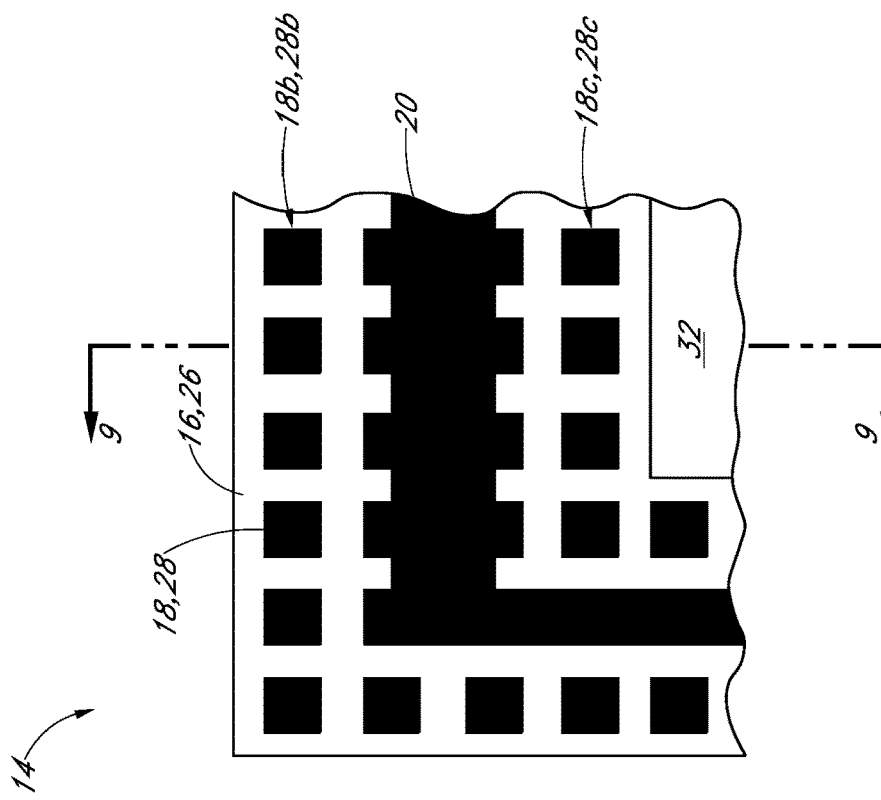
FIG. 8B is a schematic sectional plan view of the interface structure of FIG. 8A, after forming the conductive structure.
Figure 8A:
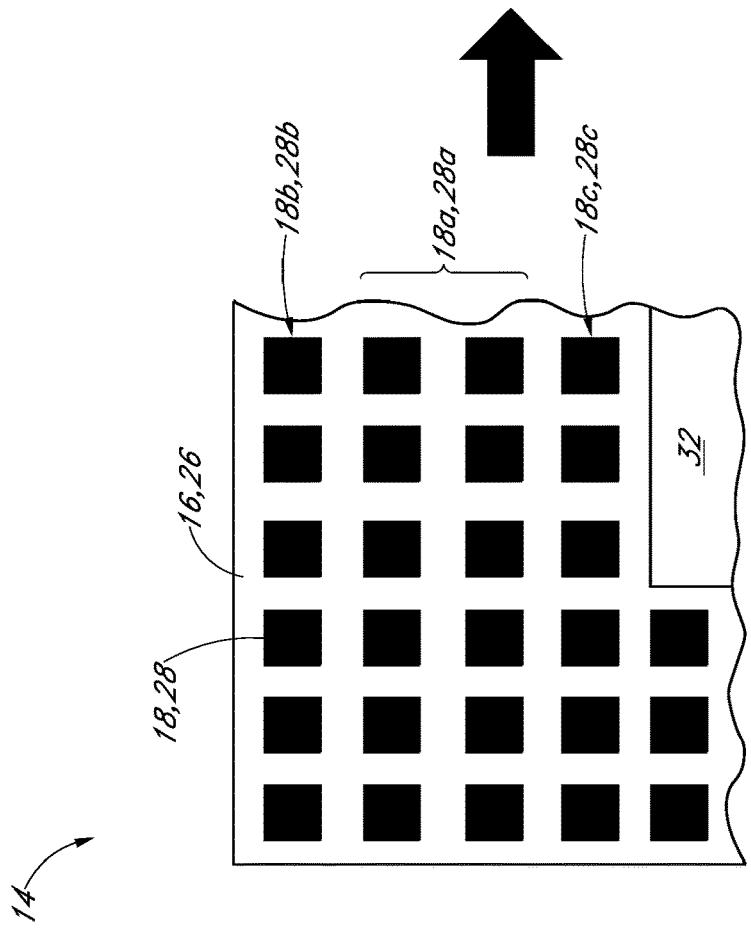
FIG. 8A is a schematic sectional plan view of a portion of an interface structure according to one embodiment, prior to forming a conductive structure.

FIG. 8A is a schematic sectional plan view of a portion of an interface structure 14 according to one embodiment, after direct bonding but prior to forming a conductive structure 20. FIG. 8B is a schematic sectional plan view of the interface structure 14, after forming the conductive structure 20. Unless otherwise noted, the components of FIGS. 8A-8B may be generally similar to or the same as like-numbered components of FIGS. 1-7. The interface structure 14 illustrated in FIGS. 8A and 8B can comprise bonded nonconductive field region 16, 26 and a plurality of bonded conductive pads 18, 28. In some embodiments, the plurality of conductive pads can comprise multiple rows or rings of conductive pads (e.g., center row(s), an outer row and an inner row) that can include center pads 18a, 28a outer pads 18b, 28b and inner pads 18c, 28c. FIG. 8B illustrates the conductive structure 20 that is disposed between the outer pads 18b, 28b and the inner pads 18c, 28c. As shown in FIG. 8B, the interface structure 20 can mechanically connect and extend between two adjacent center rows of pads 18a, 28a.

Figure 9:
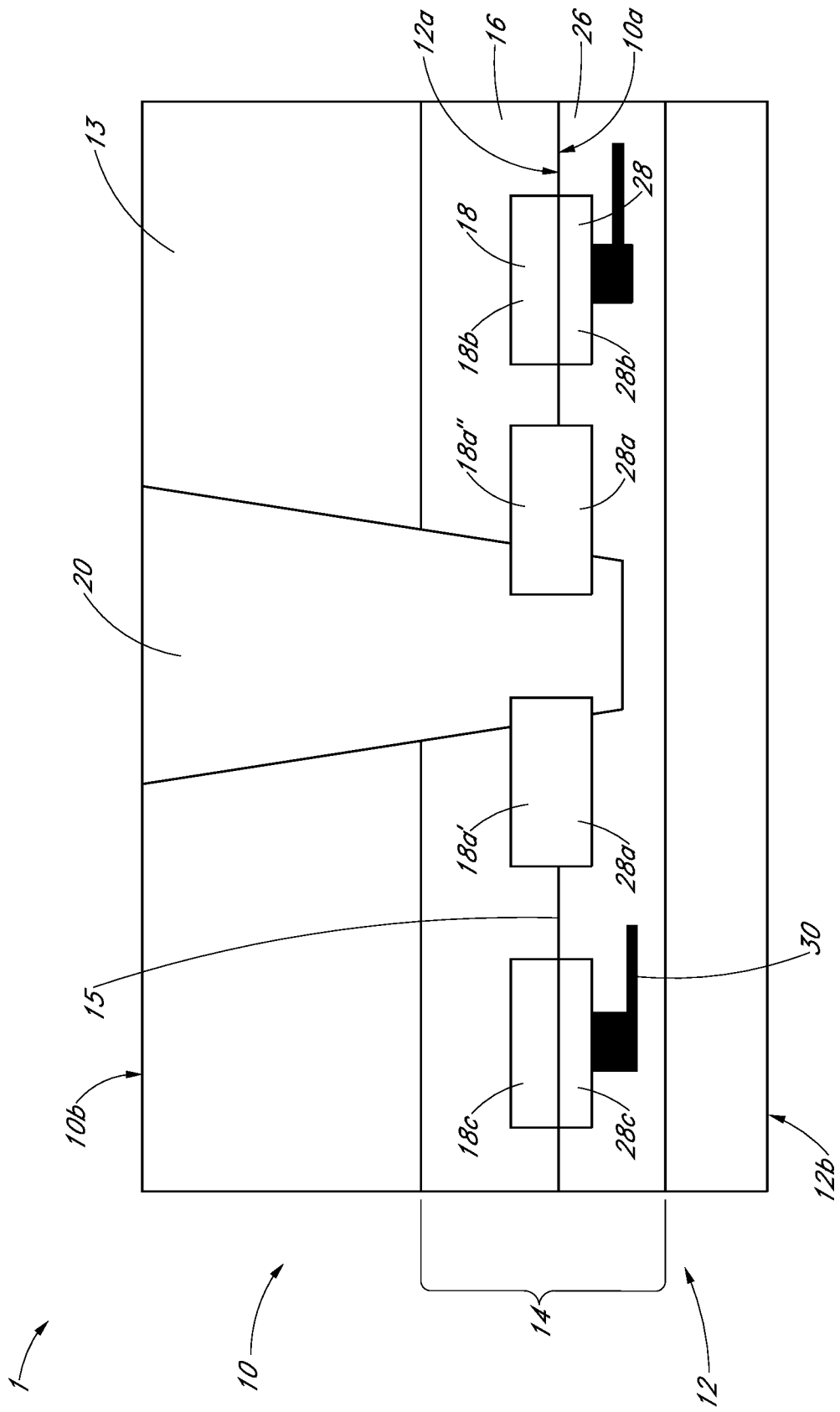
FIG. 9 is a schematic side sectional view of a portion of a bonded structure, according to one embodiment.

FIG. 9 is a schematic side sectional view of a portion of a bonded structure 1, according to one embodiment. The bonded structure 1 can include the interface structure 14 of FIG. 8B. The cross section of the bonded structure can include a first element 10 bonded to a second element 12 along an interface structure 14. The first element 10 can include a nonconductive field region 16 and a plurality of conductive pads 18. The plurality of conductive pads 18 can include multiple (e.g., two) rows or rings of center pads 18a', 18a", an outer pad 18b and an inner pad 18c. The second element 12 can include a nonconductive field region 26 and a plurality of conductive pads 28. The plurality conductive pads 28 can include multiple (e.g., two) rows or rings of center pads 28a', 28a", an outer pad 28b and an inner pads 28c. The cross section of the bonded structure can also include a conductive structure 20 between the center pads 18a', 28a' and the other center pads 18a", 28a".

The conductive structure 20 can extend from a back side 10b of the first element 10 to the interface structure 14. As illustrated in FIG. 9, the conductive structure 20 can extend from the back side 10b of the first element 10 through the bulk region 13, the nonconductive field region 16 of the first element 10, and a portion of the nonconductive field region 26 of the second element 12. The conductive structure 20 can be in contact with and extend between the center pads 18a', 18a", 28a', 28a". Thus, in FIG. 9, the conductive structure 20 can be sufficiently wide so as to span two rings of contact pads. In some embodiments, the conductive structure 20 can extend from the back side 10b of the first element 10 completely through the nonconductive field regions 16, 26. In some embodiments, the conductive structure 20 can extend from the back side 10b of the first element 10 completely through the first and second elements 10, 12 to a back side 12b of the second element 12.

Figure 10B:
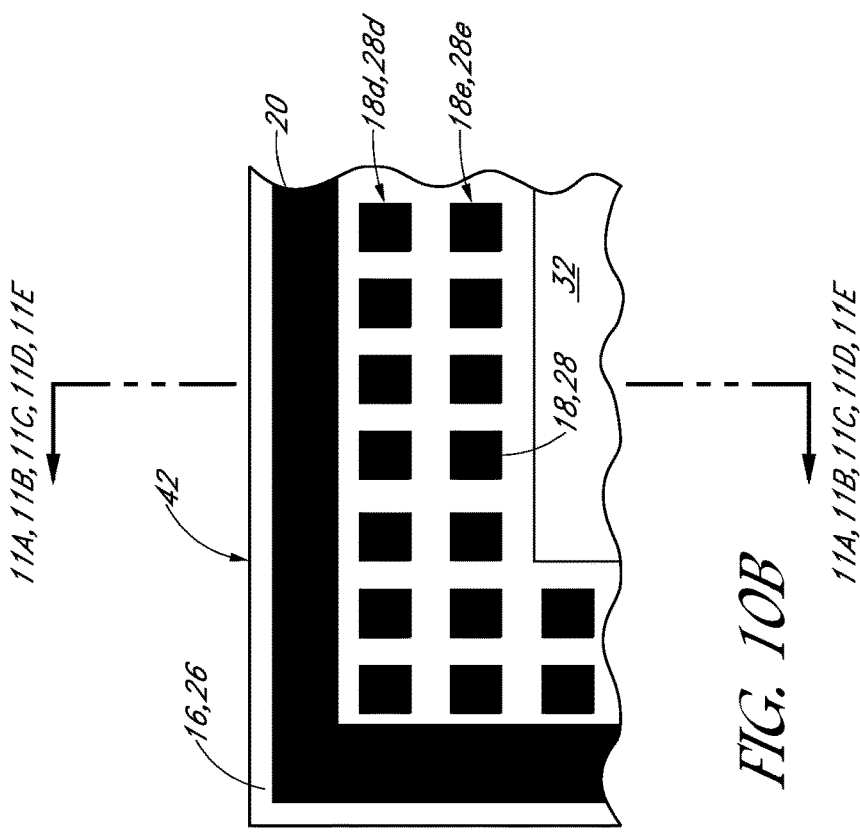
FIG. 10B is a schematic sectional plan view of the interface structure of FIG. 10A, after forming the conductive structure.
Figure 10A:
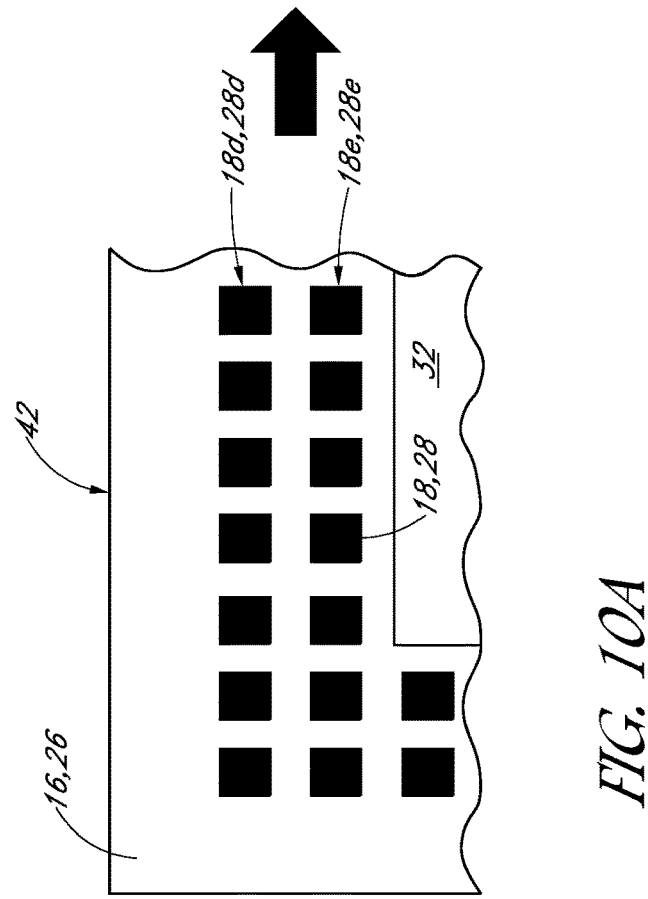
FIG. 10A is a schematic sectional plan view of a portion of an interface structure according to one embodiment, prior to forming a conductive structure.

FIG. 10A is a schematic sectional plan view of a portion of an interface structure 14 according to one embodiment, after direct bonding but prior to forming a conductive structure 20. FIG. 10B is a schematic sectional plan view of the interface structure 14, after forming the conductive structure 20. The interface structure 14 illustrated in FIGS. 10A and 10B can comprise bonded nonconductive field region 16, 26 and a plurality of bonded conductive pads 18, 28. In some embodiments, the plurality of conductive pads can comprise rows of conductive pads that can include outer pads 18d, 28d and inner pads 18e, 28e that is positioned closer to the cavity 32 than the outer pads 18d, 28d. FIG. 10B illustrates the conductive structure 20 that is disposed between the outer pads 18b, 28b and an outer side 42 of the interface structure 14. In the embodiment of FIG. 10B, the conductive structure 20 can define an effectively closed profile around the interior of the bonded structure, and can be disposed outside of the contact pads 18d, 18e, 28d, 28e. In the illustrated embodiment, the conductive structure 20 can be laterally inset relative to the outer side 42 such that the bonded field regions 16, 26 are exposed at the outer side 42. In other embodiments, as explained herein, the conductive structure 20 can be exposed at the outer side 42.

Figure 11A:
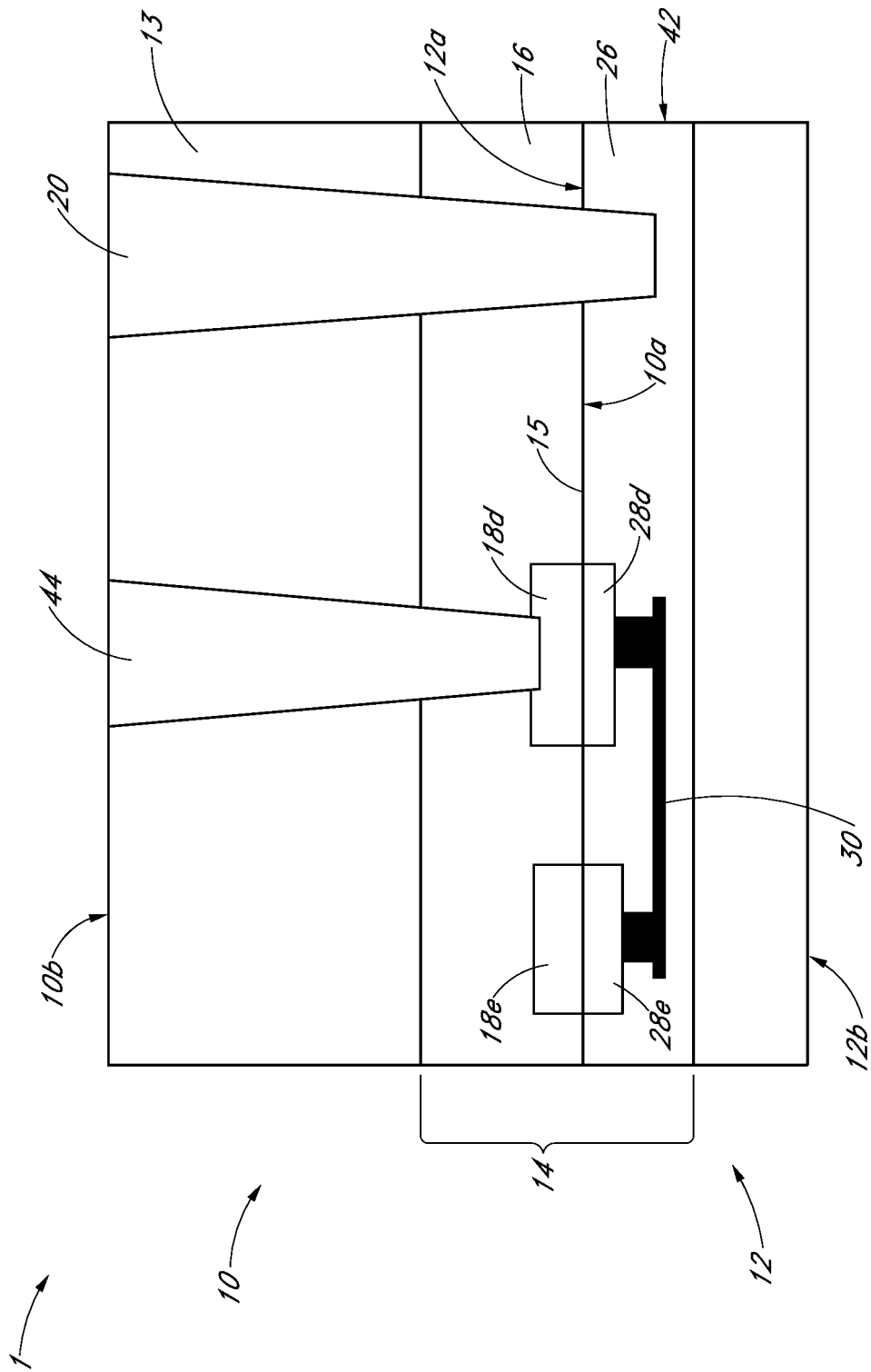
FIG. 11A is a schematic side sectional view of a portion of a bonded structure, according to one embodiment.

FIG. 11A is a schematic side sectional view of a portion of a bonded structure 1, according to one embodiment. The bonded structure can include the interface structure 14 of FIG. 10B, in which the conductive structure 20 can be disposed on the outside of the contact pads 18, 28. The cross section of the bonded structure can include a first element 10 bonded to a second element 12 along an interface structure 14. The first element 10 can include a nonconductive field region 16 and a plurality of conductive pads 18. The plurality of conductive pads 18 can include an outer pad 18d and an inner pad 18e. The second element 12 can include a nonconductive field region 26 and a plurality of conductive pads 28. The plurality conductive pads 28 can include an outer pad 28d and an inner pad 28e. The cross section of the bonded structure can also include a conductive structure 20 between the outer pads 18b, 28b and an outer side 42 of the interface structure 14.

The conductive structure 20 can extend from a back side 10b of the first element 10 to the interface structure 14. As illustrated in FIG. 11A, the conductive structure 20 can extend from the back side 10b of the first element 10 through the bulk region 13, the nonconductive field region 16 and a portion of the nonconductive field region 26. In the illustrated embodiment, the conductive structure 20 can terminate within the nonconductive field region 26 of the second element 12. In some embodiments, the conductive structure 20 can extend from the back side 10b of the first element 10 completely through the nonconductive field regions 16, 26. In some embodiments, the conductive structure 20 can extend from the back side 10b of the first element 10 completely through the first and second elements 10, 12 to a back side 12b of the second element 12.

The cross section of the bonded structure can also include a conductive via 44. The conductive via 44 can extend from the back side 10b of the first element 10 to the outer pad 18d. In some embodiments, conductive pad 28d may be directly bonded to the conductive via 44 in absence of the conductive pad 18d. In some embodiments, the conductive via 44 can extend from the back side 10b of the first element 10 to the inner pad 18e. The conductive via 44 can be formed prior to or after bonding the first element 10 and the second element 12. In some embodiments, the conductive via 44 can be elongated. In some embodiments, the conductive via 44 can provide electrical access on the back side 10b of the first element 10 for the conductive pads 18, 28. The conductive via 44 on the back side 10b can be configured to connect to a system board by way of, for example, a wirebond, a solder ball, etc. In FIGS. 11A-11D, and 13B, both the via 44 and the conductive structure 20 extend from one side (the back side 10b of the first element 10). However, in some embodiments, the via 44 and the conductive structure 20 can extend from different sides of the bonded structure (the back side 10b of the first element 10 and the back side 12b of the second element 12). In some other embodiments, the via 44 and/or the conductive structure 20 can extend from both sides of the bonded structure (the back side 10b of the first element 10 and the back side 12b of the second element 12).

Figure 11B:
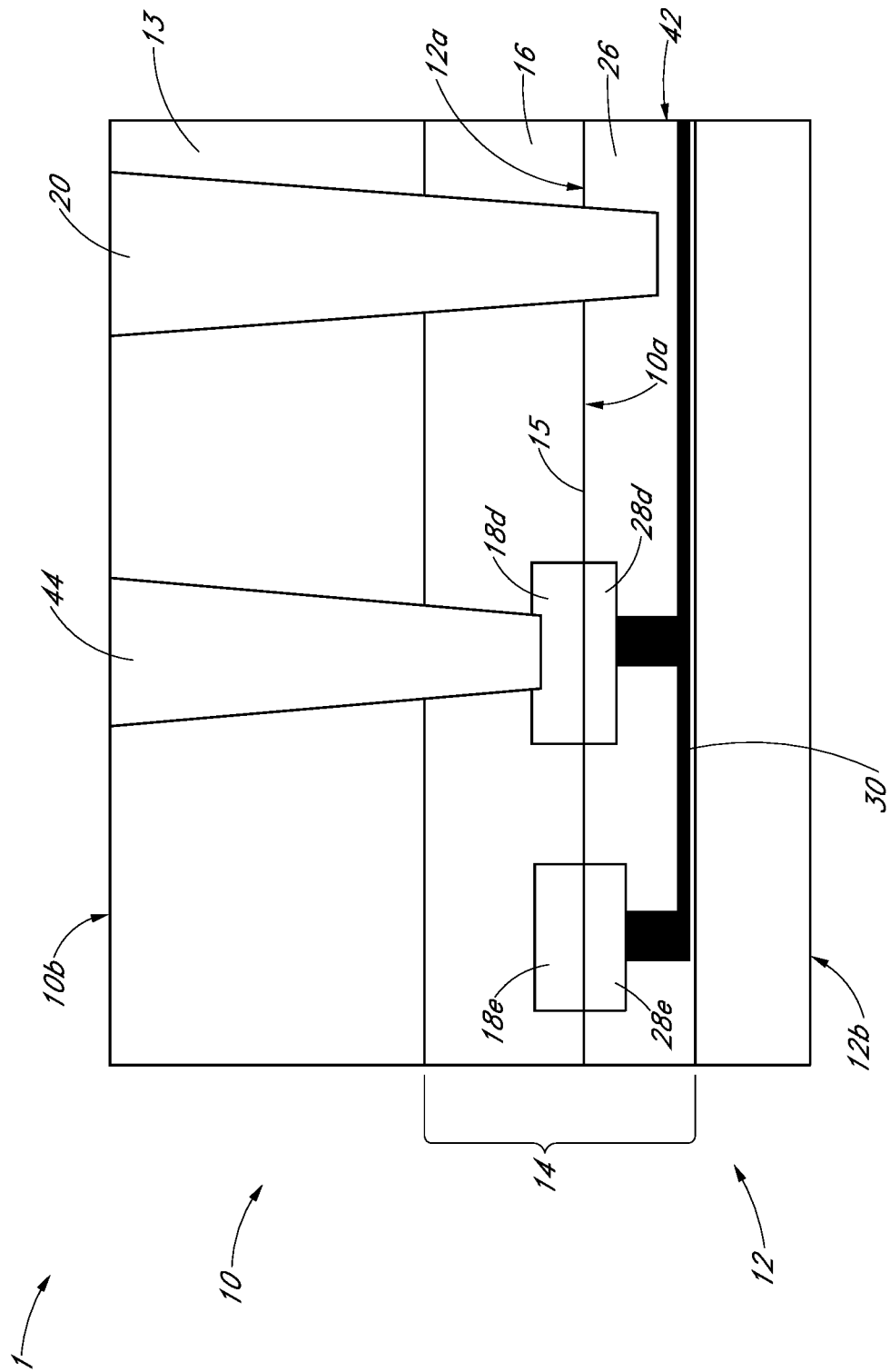
FIG. 11B is a schematic side sectional view of a portion of a bonded structure, according to another embodiment.

FIG. 11B is a schematic side sectional view of a portion of a bonded structure, according to one embodiment. FIG. 11B is generally similar to FIG. 11A except in FIG. 11B, the interconnect 30 extends horizontally through the nonconductive field region 26 underneath the conductive structure 20 to the outer side 42 of the interface structure. The interconnect 30 can provide electrical communication to one or more of the conductive pads 18, 28.

Figure 11C:
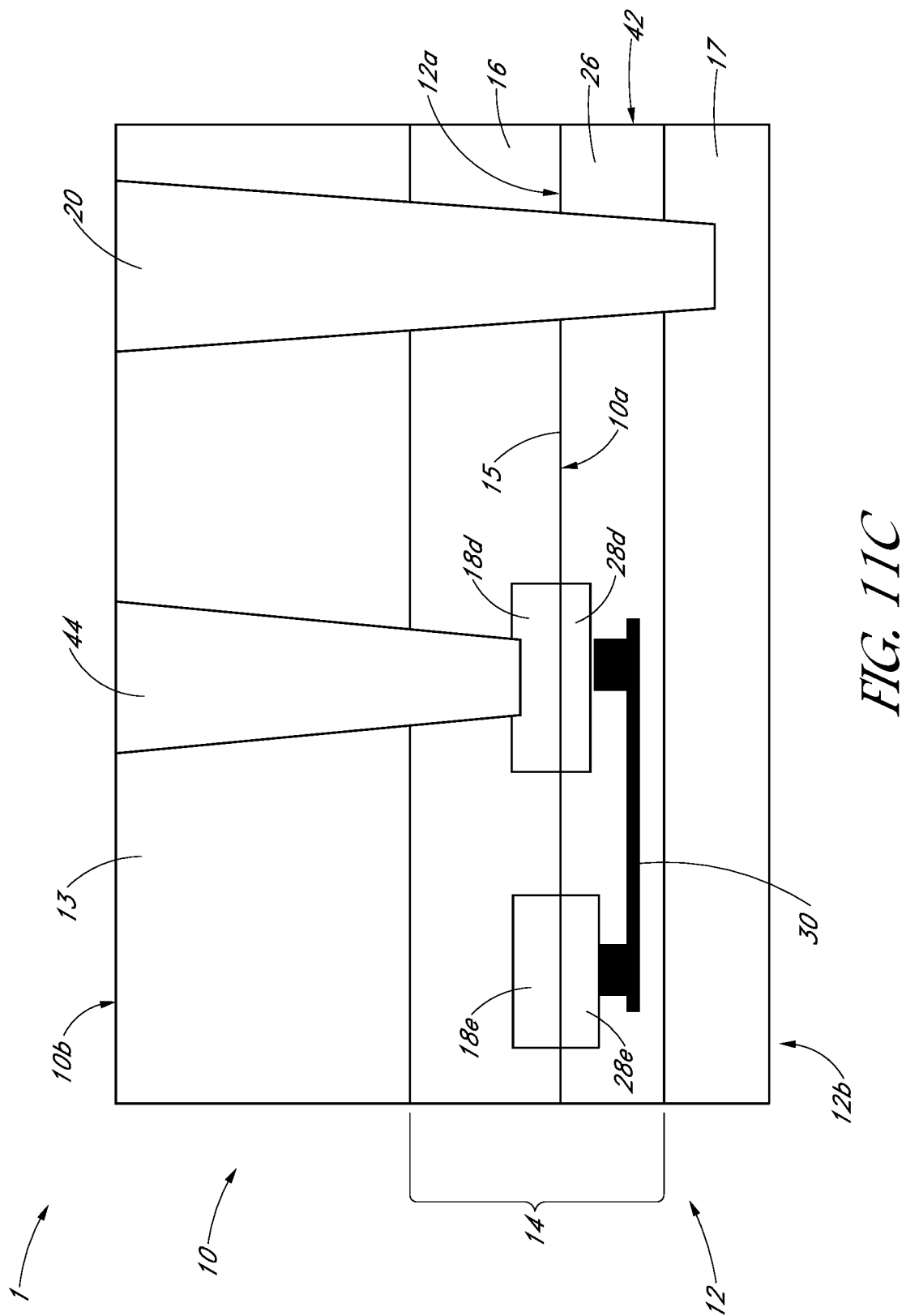
FIG. 11C is a schematic side sectional view of a portion of a bonded structure, according to another embodiment.

FIG. 11C is a schematic side sectional view of a portion of a bonded structure 1, according to one embodiment. FIG. 11C is generally similar to FIG. 11A except in FIG. 11C, the conductive structure 20 extend from the back side 10b of the first element 10 through the nonconductive field region 16 and the nonconductive field region 26, and partially through the bulk portion 17 (e.g., silicon (Si)) of the second element 12. In some embodiments, the embodiment illustrated in FIG. 11C can provide an improved seal for the cavity 32 as compared with the embodiment illustrated in FIG. 11A.

Figure 11D:
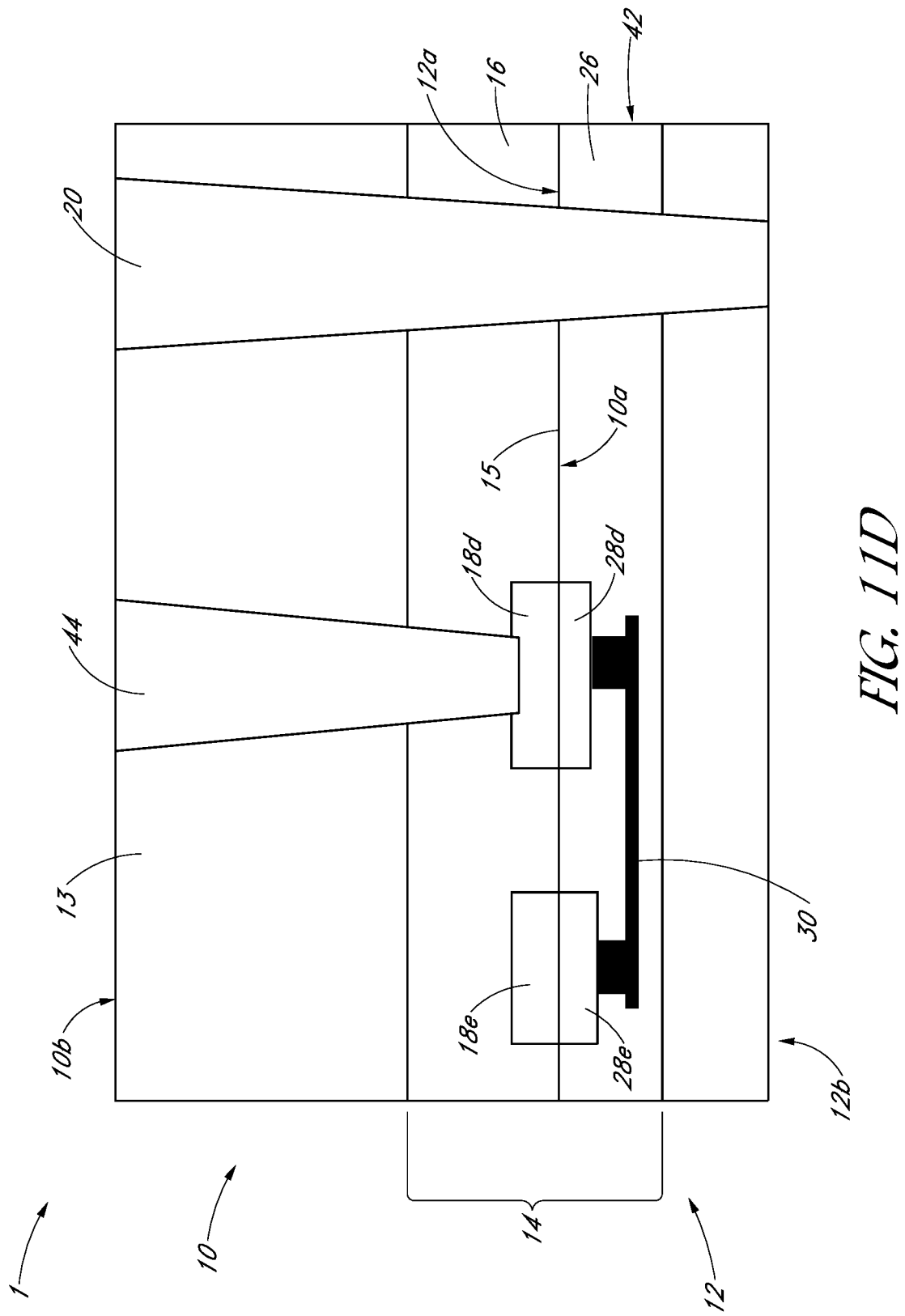
FIG. 11D is a schematic side sectional view of a portion of a bonded structure, according to another embodiment.

FIG. 11D is a schematic side sectional view of a portion of a bonded structure 1, according to one embodiment. FIG. 11D is generally similar to FIG. 11A except in FIG. 11D, the conductive structure 20 extends from the back side 10b of the first element 10 through the first element 10 and the second element 12 to the back side 12b of the second element 12. In some embodiments, the embodiment illustrated in FIG. 11D can provide an improved seal for the cavity 32 as compared with the embodiment illustrated in FIG. 11A.

Figure 11E:
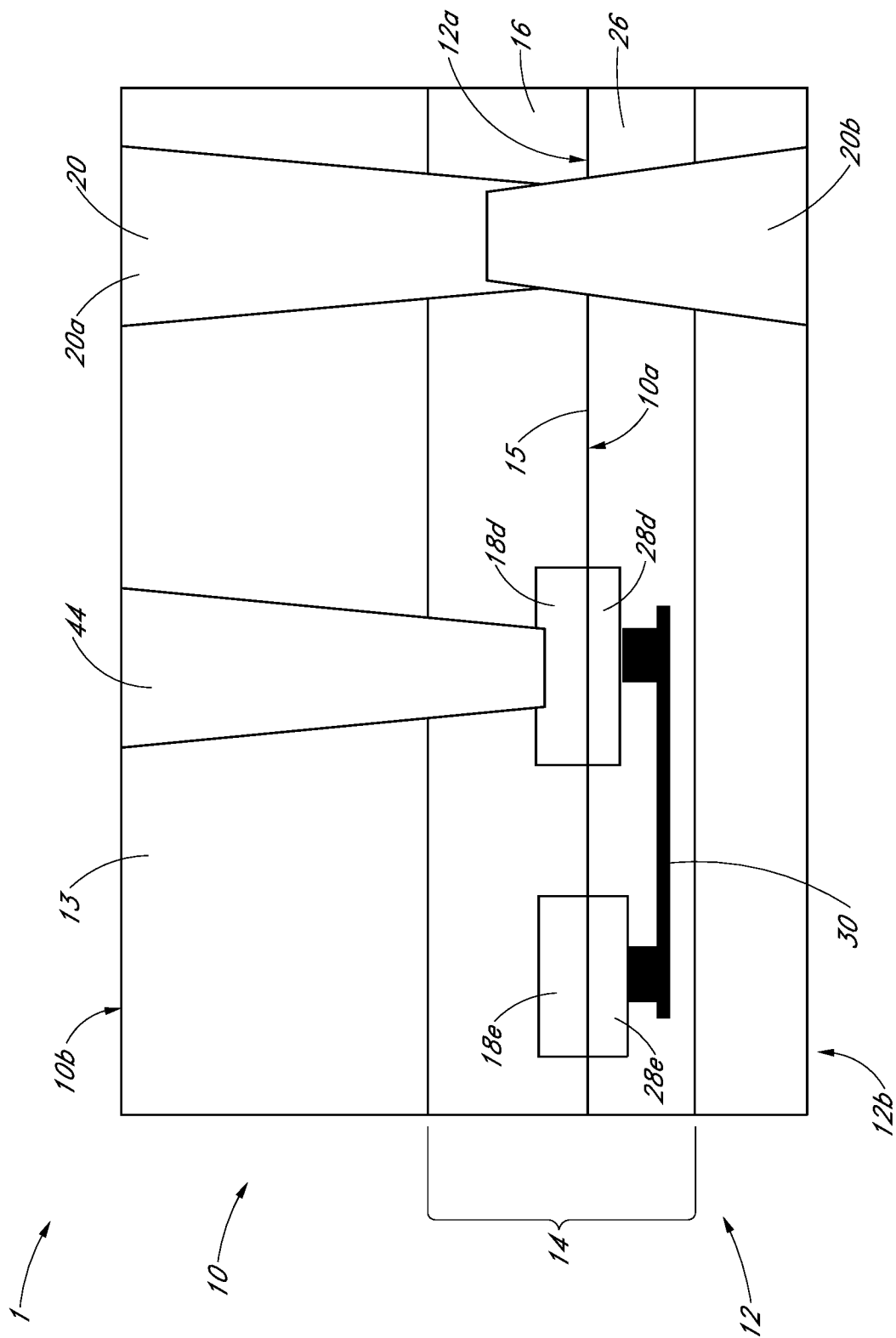
FIG. 11E is a schematic side sectional view of a portion of a bonded structure, according to another embodiment.

FIG. 11E is a schematic side sectional view of a portion of a bonded structure 1, according to one embodiment. FIG. 11E is generally similar to FIG. 11A except in FIG. 11E, the conductive structure 20 comprises a first conductive structure 20a and a second conductive structure 20b. The first conductive structure 20a extends from the back side 10b of the first element 10 to the interface structure 14, and the second conductive structure 20b extends from the back side 12b of the second element 12 to the interface structure 14. The first conductive structure 20a can be in contact with the second conductive structure 20b. In other embodiments, the first conductive structure 20a and the second conductive structure 20b can be laterally offset.

Figure 12A:
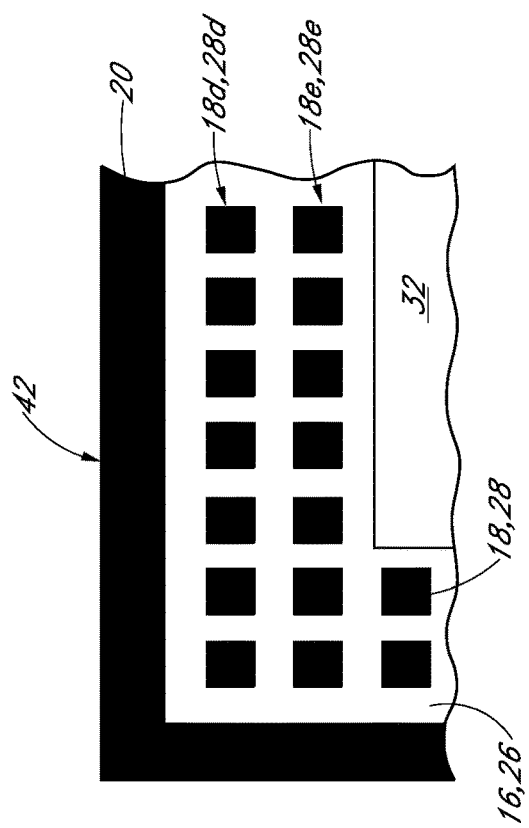
FIG. 12A is a schematic sectional plan view of a portion of an interface structure according to one embodiment, prior to forming a conductive structure.
Figure 12B:
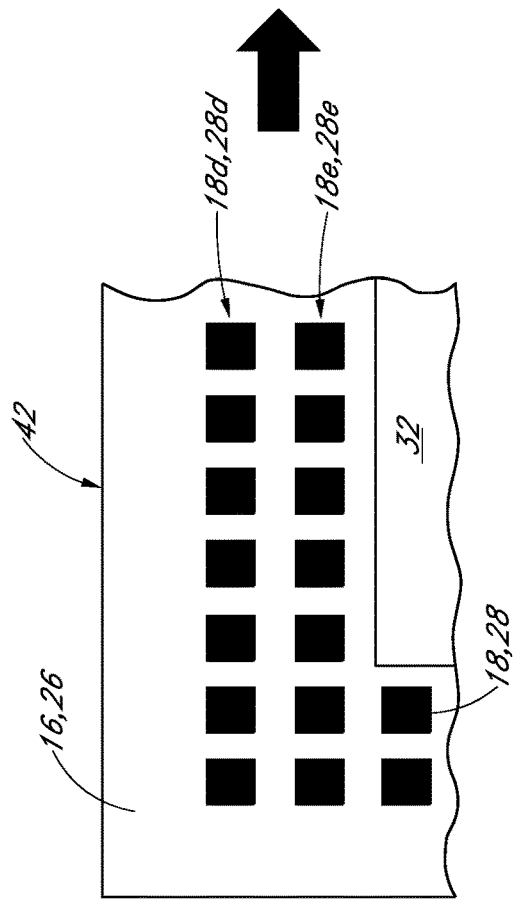
FIG. 12B is a schematic sectional plan view of the interface structure of FIG. 12A, after forming the conductive structure.

FIG. 12A is a schematic sectional plan view of a portion of an interface structure 14 according to one embodiment, after direct bonding but prior to forming a conductive structure 20. FIG. 12B is a schematic sectional plan view of the interface structure 14, after forming the conductive structure 20. The interface structure 14 illustrated in FIGS. 12A and 12B can comprise bonded nonconductive field regions 16, 26 and a plurality of bonded conductive contact pads 18, 28. In some embodiments, the plurality of conductive pads can comprise rows of conductive pads that can include outer pads 18d, 28d and inner pads 18e, 28e that are positioned closer to the cavity 32 than the outer pads 18d, 28d. FIG. 12B illustrates the conductive structure 20 being disposed along, and exposed at, an outer side 42 (e.g., an exterior or outermost side surface) of the interface structure 14.

FIG. 13A is a schematic side sectional view of a portion of a bonded structure 1, according to one embodiment. The bonded structure 1 can include the interface structure 14 of FIG. 12B, in which the conductive structure 20 is exposed at the outer side 42. The cross section of the bonded structure 1 can include a first element 10 bonded to a second element 12 along an interface structure 14. The first element 10 can include a nonconductive field region 16 and a plurality of conductive contact pads 18. The plurality of conductive contact pads 18 can include an outer pad 18d and an inner pad 18e. The second element 12 can include a nonconductive field region 26 and a plurality of conductive contact pads 28. The plurality conductive pads 28 can include an outer pad 28d and an inner pad 28e. The cross section of the bonded structure can also include a conductive structure 20 that is disposed along the outer side 42 of the interface structure 14. In some embodiments, the conductive structure 20 can be exposed to the outside environs. The conductive structure 20 illustrated in FIG. 13A is tapered. However, the conductive structure 20 may not be tapered, in other embodiments. In some embodiments, the conductive structure 20 can be plated on a portion of an outer surface of the bonded structure. In some embodiments, the conductive structure 20 can be formed in a channel 36 formed during a dicing process used to singulate the bonded structure. For example, the conductive structure 20 can comprise a conformal via in which the conductive structure includes a conductive material that conforms to a surface of the channel 36. In FIG. 13A, the conductive structure 20 extends through the bulk region 13, the nonconductive field region 16 of the first element 10, the nonconductive field region 26 of the second element 12, and a portion of the bulk region 17 of the second element 12. In the illustrated embodiment, the conductive structure 20 can terminate within the bulk region 17 of the second element 12.

Figure 13B:
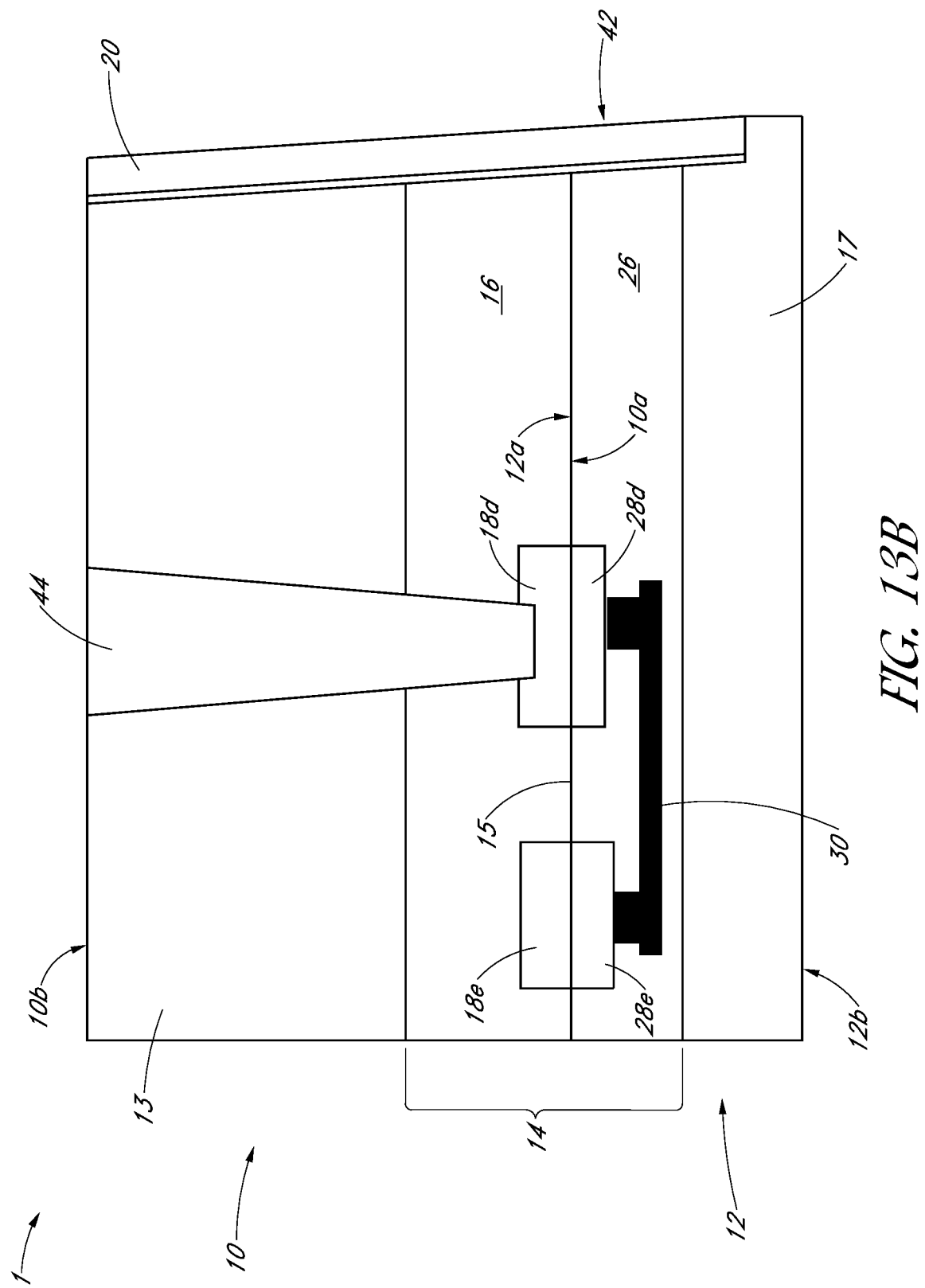
FIG. 13B is a schematic side sectional view of a portion of a bonded structure, according to another embodiment.

FIG. 13B is a schematic side sectional view of a portion of a bonded structure 1, according to one embodiment. FIG. 13B is generally similar to FIG. 13A except the cross section of the bonded structure in FIG. 13B includes a conductive via 44. The conductive via 44 can extend from the back side 10b of the first element 10 to the outer pad 18d. In some embodiments, the conductive via 44 can extend from the back side 10b of the first element 10 to the inner pad 18e. The conductive via 44 can be formed prior to or after bonding the first element 10 and the second element 12. In some embodiments, the conductive via 44 can be elongated. In some embodiments, the conductive via 44 can provide electrical access on the back side 10b of the first element 10 to the conductive pads 18, 28.

Figure 13C:
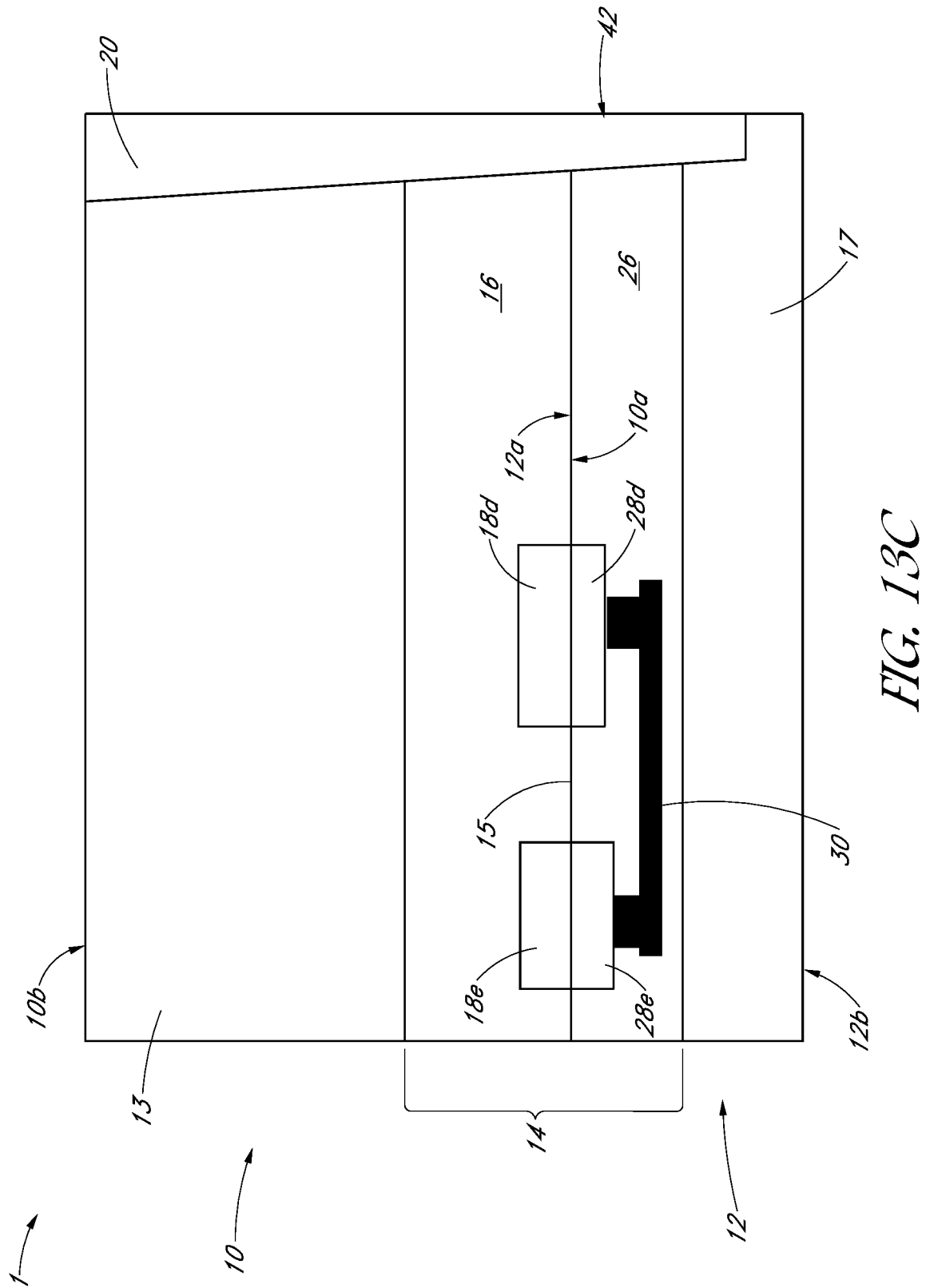
FIG. 13C is a schematic side sectional view of a portion of a bonded structure, according to another embodiment.

FIG. 13C is a schematic side sectional view of a portion of a bonded structure 1, according to one embodiment. FIG. 13C is generally similar to FIG. 13A. However, unlike the conductive structure 20 of FIG. 13A, the conductive structure 20 can comprise a filled via. In FIGS. 13A to 13C, because the conductive structure 20 is disposed along an outer side 42 of the interface structure 14, the conductive structure 20 can mitigate or prevent the bonded structure from being damaged (e.g., cracked) during a manufacturing process (e.g., dicing) and/or during use of the bonded structure.

FIGS. 14A to 14E illustrate a process flow of manufacturing the bonded structure 1, according to various embodiments. In FIGS. 14A to 14E, a first element 10 that is directly bonded with a second element 12 along an interface structure 14 is illustrated. In some embodiments, the interface structure 14 can include a nonconductive field region and a conductive pad. In the manufacturing process illustrated in FIGS. 14A to 14E, a plurality of bonded structures 1 can be formed from a wafer.

Figure 14A:
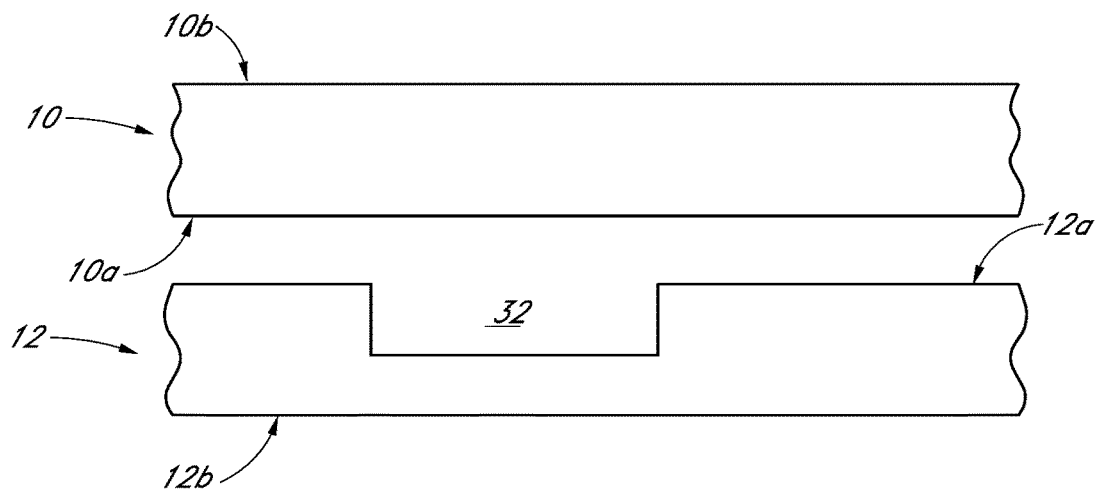
FIGS. 14A to 14E illustrate a process flow of manufacturing the bonded structure, according to one embodiment.

In FIG. 14A, the first element 10 and the second element 12 can be provided. In some embodiments, the first element 10 can comprise a nonconductive field region (not shown) and a plurality of conductive pads (not shown) on a front side 10a of the first element 10. In some embodiments, the second element 12 can comprise a nonconductive region (not shown) and a plurality of conductive pads (not shown) on a front side 12a of the second element 12. The second element 12 can also comprise a cavity 32 that is formed on the front side 12a. In some embodiments, one or more components can be disposed in the cavity 32. In some embodiments, one or more components can be embedded in the first element 10 and/or the second element 12.

Figure 14B:
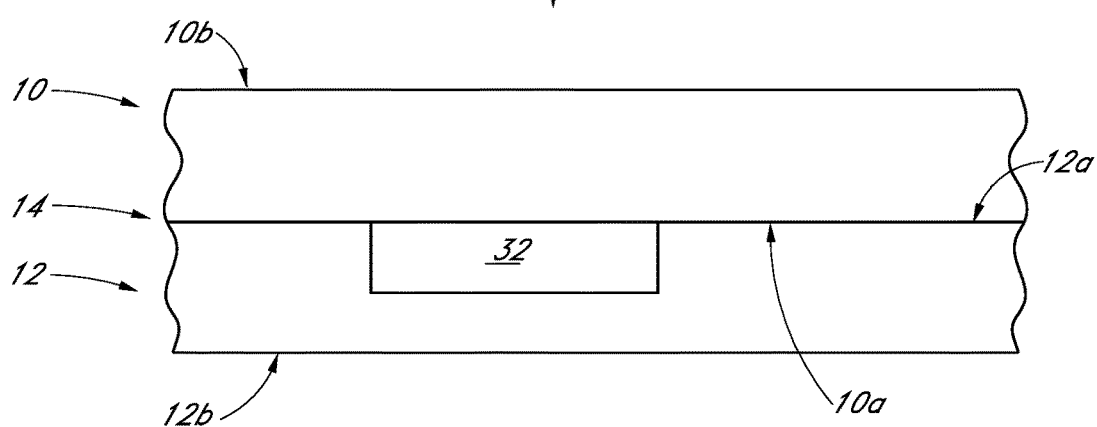

In FIG. 14B, the first element 10 and the second element 12 can be bonded to one another along the interface structure 14. The first element 10 and the second element 12 can be directly bonded to one another without an adhesive, as explained above. The first element 10 and the second element 12 can be electrically and/or mechanically connected to one another. The first element 10 and the second element 12 can define the cavity 32. The cavity 32 can be enclosed and sealed from the outside environs.

Figure 14C:
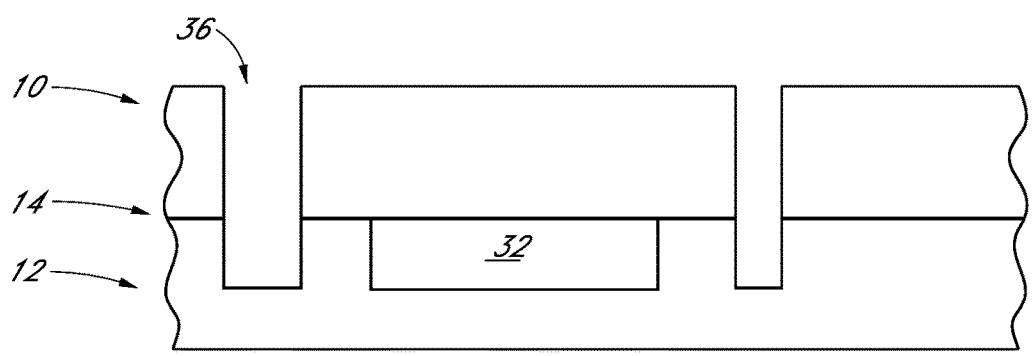

In FIG. 14C, a channel 36 can be formed. The channel 36 can extend from the back side 10*b* of the element 10 to the interface structure 14. In some embodiments, the channel 36 can extend from the back side 10*b* of the element 10 through the interface structure 14 to a body of the second element 12. In some embodiments, the channel 36 can be formed by way of drilling (e.g., laser drilling), or etching (e.g., wet etching or dry etching).

Figure 14D:
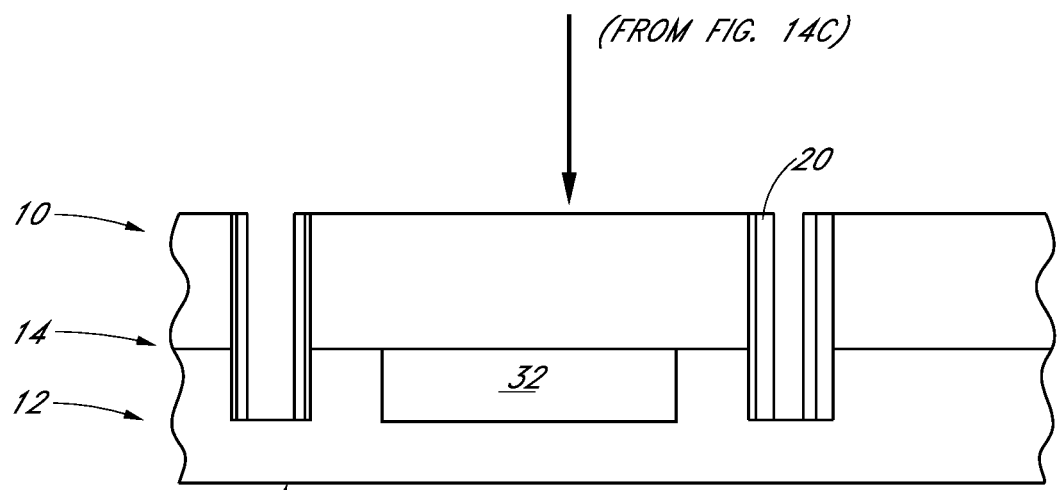

In FIG. 14D, a conductive structure 20 can be formed. In some embodiments, the conductive structure 20 can comprise a via. In some embodiments, the via can comprise a filled via or a conformal via. In some embodiments, the filled via can comprise a layered filled via in which a conductive filler comprises multiple layers. In some embodiments, the conductive structure 20 can comprise noble metals. In some embodiments, the conductive structure 20 can comprise any suitable conductor, such as copper, gold, tungsten, titanium, titanium nitride, tantalum, tantalum nitride, tin, nickel, silicon nitride, etc.

Figure 14E:
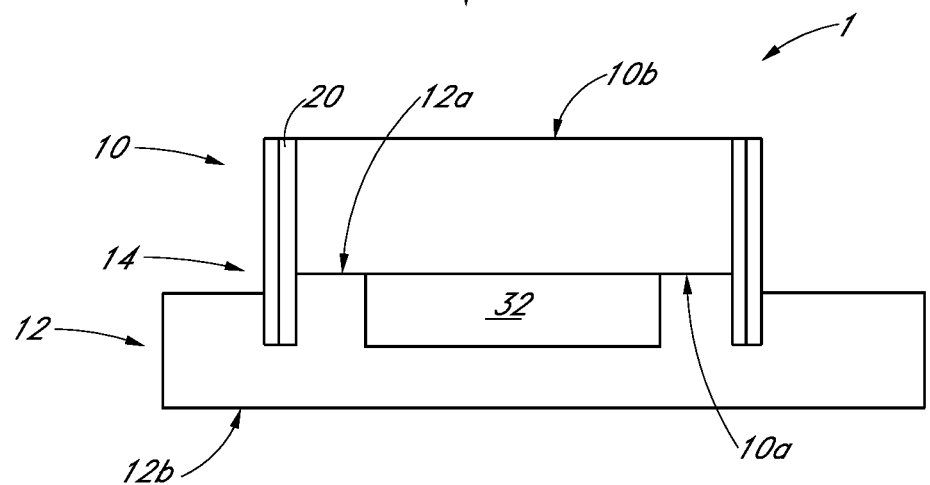

In FIG. 14E, portions of the first element 10 and/or the second element 12 can be etched away to form the bonded structure 1. In the illustrated embodiment, the first element 10 can act as a lid for the cavity 32. In some embodiments, the second element 12 can have a larger dimension than the first element 10. In some embodiments, the second element 12 can comprise a carrier. In some applications, a MEMS element can be disposed in the cavity 32. In some embodiments, the first element 10 and/or the second element 12 can comprise interconnects formed in the elements 10, 12.

Figure 15:
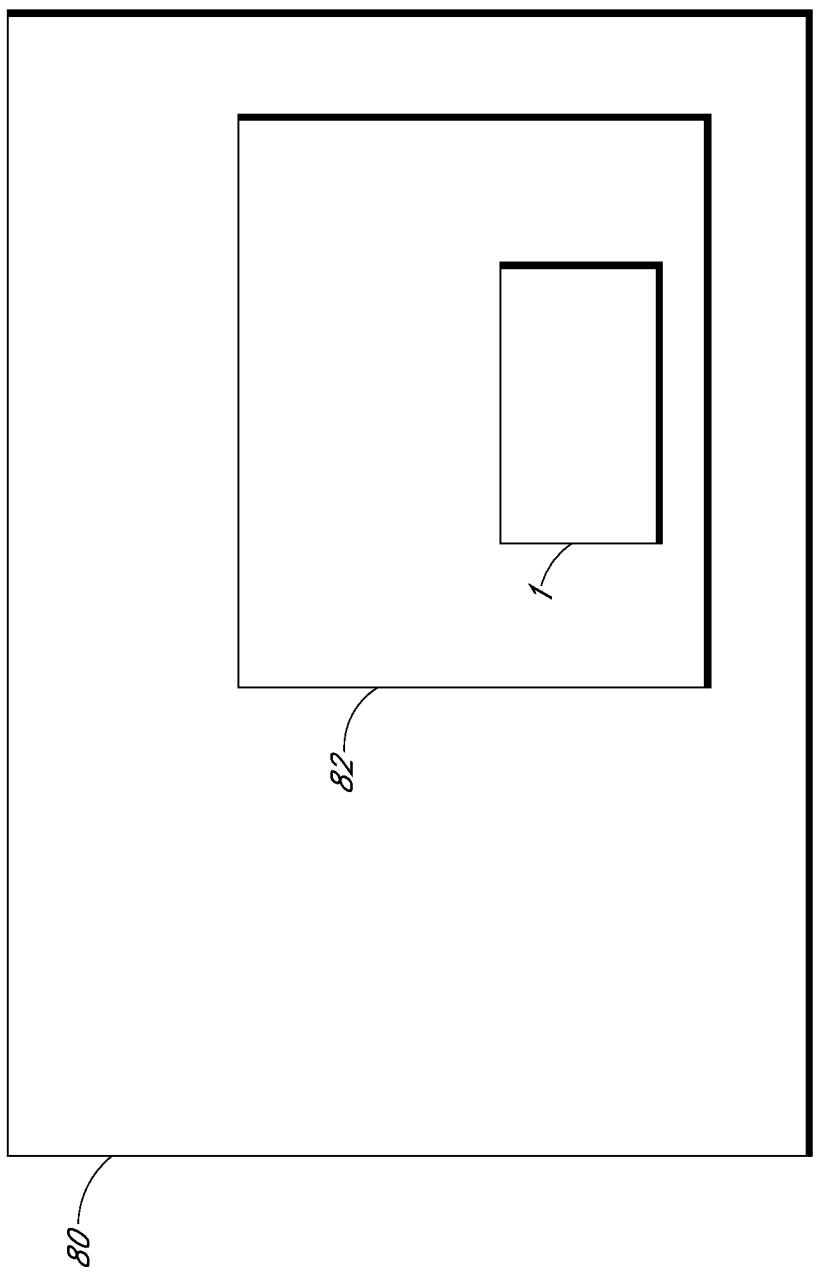
FIG. 15 is a schematic diagram of an electronic system incorporating one or more bonded structures, according to various embodiments.

FIG. 15 is a schematic diagram of an electronic system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The system 80 shown in FIG. 15 can comprise any of the bonded structures 1 and associated interface structures 14 shown and described herein.

In one aspect, a bonded structure is disclosed. The bonded structure can include a first element that has a front side and a back side opposite the front side. The first element can have a first plurality of conductive contact pads and a first nonconductive field region at the front side of the first element. The bonded structure can also include a second element that has a second plurality of conductive contact pads and a second nonconductive field region at a front side of the second element. The second plurality of contact pads can be directly bonded to the first plurality of contact pads along an interface structure without an intervening adhesive. At least some of the directly bonded contact pads can provide electrical communication between the first and second elements. The bonded structure can also include an integrated device that is coupled to or formed with the first element or the second element. The bonded structure can further include a laterally elongate conductive structure that extends from the back side of the first element to the interface structure. The elongate conductive structure can provide an effectively closed profile around the integrated device.

In one embodiment, the first nonconductive field region and the second nonconductive field region are directly bonded without an intervening adhesive.

In one embodiment, the bonded structure further includes a cavity in the bonded structure. The elongate conductive structure can extend around the cavity in the effectively closed profile. In one embodiment, the interface structure includes a bonding interface between the first and second elements. The elongate conductive structure can extend from the back side of the first element to at least the bonding interface.

In one embodiment, the elongate conductive structure is disposed continuously around the integrated device to define a completely closed profile.

In one embodiment, the elongate conductive structure contacts a first contact pad of the first plurality of contact pads.

In one embodiment, the second element further includes a second contact pad of the second plurality of contact pads at the front side of the second element. The elongate conductive structure can extend through a bonding interface of the interface structure to contact the second contact pad. The first element can further include a third contact pad of the first plurality of contact pads at the front side of the first element. The second element can further includes a fourth contact pad of the second plurality of contact pads at the front side of the second element. The third conductive pad can be directly bonded to the fourth conductive pad. The elongate conductive structure can be disposed between and contacts the second conductive pad and the third conductive pad. The elongate conductive structure can contact the fourth conductive pad. The bonded structure can further include a via that extends at least partially through the first element from the back side of the first element. The via can be in contact with the third conductive pad. The elongate conductive structure can extend at least partially through the second nonconductive field region. The elongate conductive structure can contact a first contact pad of the first plurality of contact pads or the second contact pad of the second plurality of contact pads. The elongate conductive structure can extend completely through the second nonconductive field region and partially through a bulk semiconductor portion of the second element. The elongate conductive structure can extend through an entire thickness of the bonded structure.

In one embodiment, the second element further includes a lateral feature that is at least partially embedded in the second nonconductive field region. The elongate conductive structure can extend through at least a portion of the second nonconductive field region to contact the lateral feature. The lateral feature can include a ring disposed around the integrated device.

In one embodiment, the elongate conductive structure is exposed on an outermost side surface of the bonded structure.

In one embodiment, the bonded structure further includes a second elongate conductive structure that extends from a back side of the second element that is opposite the front side of the second element to the interface structure. The second elongate conductive structure can provide an effectively closed profile around the integrated device.

In one embodiment, one of the first plurality of contact pads and one of the second plurality of contact pads define a first bonded pair of pads and another one of the first plurality of contact pads and another one of the second plurality of contact pads define a second pair of bonded pads. The elongate conductive structure can be positioned between the first pair of bonded pads and the second pair of bonded pads. The first bonded pad and second bonded pad can be electrically connected through an interconnect.

In one aspect, a bonded structure is disclosed. The bonded structure can include a first element and a second element. The second element is bonded to the first element along an interface structure. The interface structure can comprise a conductive interface feature and a nonconductive interface feature that is disposed about the conductive interface feature. The conductive interface feature can provide mechanical and electrical connection between the first and second elements. The bonded structure can also include an integrated device that is coupled to or formed with the first element or the second element. The bonded structure can further include a laterally elongate conductive structure that extends from a back side of the first element to the interface structure. The elongate conductive structure can provide an effectively closed profile around the integrated device.

In one embodiment, the conductive interface feature includes a plurality of directly bonded conductive pads disposed around the integrated device.

In one embodiment, the first element and the second element are directly bonded without an intervening adhesive.

In one embodiment, the bonded structure further includes a via that extends at least partially through the first element from the back side of the first element. The via can be in contact with the conductive interface feature.

In one embodiment, the elongate conductive structure extends through the interface structure.

In one embodiment, the elongate conductive structure extends through an entire thickness of the bonded structure.

In one aspect, a method of forming a bonded structure is disclosed. The method can include providing a first element that includes a first contact pad at a bonding surface of the first element. The method can also include providing a second element that includes a second contact pad at a bonding surface of the second element. The method can also include directly bonding the first contact pad of the first element to the second contact pad of the second element along an interface structure without an intervening adhesive. The method also includes forming a laterally elongate channel from a back side of the first element to at least the interface structure. The method can further include providing an elongate conductive structure within the channel.

In one embodiment, bonding includes directly bonding a first nonconductive field region of the first element to a second nonconductive field region of the second element along the interface structure without an intervening adhesive.

In one embodiment, forming the elongate channel includes forming the elongate channel from the back side of the first element to at least the bonding surface of the second element. Forming the elongate channel can include forming the elongate channel from the back side of the first element through an entire thickness of the bonded structure.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonded structure comprising:
a first element having a front side and a back side opposite the front side, the first element having a first plurality of conductive contact pads and a first nonconductive field region at the front side of the first element, the first nonconductive field region and the first plurality of conductive contact pads disposed on a semiconductor region of the first element;
a second element having a second plurality of conductive contact pads and a second nonconductive field region at a front side of the second element, the second plurality of contact pads directly bonded to the first plurality of contact pads along a bonding interface without an intervening adhesive, at least some of the directly bonded contact pads providing electrical communication between the first and second elements;
an integrated device coupled to or formed in the first element or the second element; and
a laterally elongated conductive structure disposed in a trench having a sidewall extending from the back side of the first element, through the semiconductor region and the first nonconductive field region, and across the bonding interface, the laterally elongated conductive structure extending continuously around multiple sides of the integrated device.

2. The bonded structure of claim 1, wherein the first nonconductive field region and the second nonconductive field region are directly bonded without an intervening adhesive.

3. The bonded structure of claim 1, further comprising a cavity in the bonded structure, the laterally elongated conductive structure extending at least partially around the cavity.

4. The bonded structure of claim 1, wherein the laterally elongated conductive structure defines a completely closed profile.

5. The bonded structure of claim 1, wherein the laterally elongated conductive structure contacts a first contact pad of the first plurality of contact pads.

6. The bonded structure of claim 1, wherein the second element further comprises a second contact pad of the second plurality of contact pads at the front side of the second element, and wherein the laterally elongated conductive structure extends through a bonding interface of the interface structure to contact the second contact pad.

7. The bonded structure of claim 6, wherein the first element further comprises a third contact pad of the first plurality of contact pads at the front side of the first element, and wherein the second element further comprises a fourth contact pad of the second plurality of contact pads at the front side of the second element, the third contact pad directly bonded to the fourth contact pad.

8. The bonded structure of claim 7, further comprising a via extending at least partially through the first element from the back side of the first element, the via being in contact with the third contact pad.

9. The bonded structure of claim 8, wherein the laterally elongated conductive structure extends at least partially through the second nonconductive field region.

10. The bonded structure of claim 9, wherein the laterally elongated conductive structure extends through an entire thickness of the bonded structure.

11. The bonded structure of claim 8, wherein the laterally elongated conductive structure contacts a first contact pad of the first plurality of contact pads or the second contact pad of the second plurality of contact pads.

12. The bonded structure of claim 1, wherein the second element further comprises a lateral feature at least partially embedded in the second nonconductive field region, the laterally elongated conductive structure extending through at least a portion of the second nonconductive field region to contact the lateral feature.

13. The bonded structure of claim 12, wherein the lateral feature comprises a ring disposed around the integrated device.

14. The bonded structure of claim 1, wherein the laterally elongated conductive structure is exposed on an outermost surface of the bonded structure.

15. The bonded structure of claim 14, wherein the exposed laterally elongated conductive structure is closer to a side edge of the first element than to the integrated device.

16. The bonded structure of claim 1, wherein the first plurality of conductive contact pads includes a first conductive contact pad and a second conductive contact pad electrically connected to one another through an interconnect, the first conductive contact pad and second conductive contact pad are electrical signal pads.

17. The bonded structure of claim 16, wherein the interconnect is routed around the laterally elongated conductive structure.

18. The bonded structure of claim 1, wherein the laterally elongated conductive structure has a continuous sidewall extending from the back side of the first element and across the bonding interface.

19. The bonded structure of claim 1, wherein the laterally elongated conductive structure provides an effectively closed profile around the integrated device.

20. A bonded structure comprising:
a first element having a front side and a back side opposite the front side, the first element having a first plurality of conductive contact pads and a first nonconductive field region at the front side of the first element;
a second element having a second plurality of conductive contact pads and a second nonconductive field region at a front side of the second element, the second plurality of conductive contact pads directly bonded to the first plurality of conductive contact pads along an interface structure without an intervening adhesive, at least some of the directly bonded contact pads providing electrical communication between the first and second elements;
an integrated device coupled to or formed in the first element or the second element; and
a laterally elongated conductive structure extending from the back side of the first element, through a semiconductor region of the first element, and to and at least partially through the interface structure, the laterally elongated conductive structure extending continuously around multiple sides of the integrated device and providing an effectively closed profile around the integrated device,
wherein one of the first plurality of conductive contact pads and one of the second plurality of conductive contact pads define a first bonded pair of pads and another one of the first plurality of conductive contact pads and another one of the second plurality of conductive contact pads define a second pair of bonded pads, and wherein at least a portion of the laterally elongated conductive structure is positioned between the first pair of bonded pads and the second pair of bonded pads from a plan view.

21. The bonded structure of claim 20, wherein the first bonded pair of pads and the second bonded pair of pads are electrically connected through an interconnect.

22. The bonded structure of claim 21, wherein the interconnect is routed around the laterally elongated conductive structure.

23. The bonded structure of claim 21, wherein the interconnect comprises a conductive trace that extends laterally through the second nonconductive field region.

24. The bonded structure of claim 23, wherein the interface structure comprises the first plurality of conductive contact pads, the first nonconductive field region, the second plurality of conductive contact pads, the second nonconductive field region, and the conductive trace.

25. The bonded structure of claim 20, wherein the laterally elongated conductive structure is exposed on an outermost surface of the bonded structure.

26. The bonded structure of claim 25, wherein the exposed laterally elongated conductive structure is closer to a side edge of the first element than to the integrated device.

27. A bonded structure comprising:
a first element having a semiconductor region;
a second element bonded to the first element along an interface structure, the interface structure comprising a conductive interface feature and a nonconductive interface feature disposed about the conductive interface feature, the conductive interface feature providing mechanical and electrical connection between the first and second elements;
an integrated device coupled to or formed in the first element or the second element; and
a laterally elongated conductive structure disposed in a trench extending from a back side of the first element, through the semiconductor region, and to and at least partially through the interface structure, the laterally elongated conductive structure extending continuously around multiple sides of the integrated device.

28. The bonded structure of claim 27, wherein the conductive interface feature comprises a plurality of directly bonded conductive pads disposed around the integrated device.

29. The bonded structure of claim 27, wherein the first element and the second element are directly bonded without an intervening adhesive.

30. The bonded structure of claim 27, further comprising a via extending at least partially through the first element from the back side of the first element, the via being in contact with the conductive interface feature.

31. The bonded structure of claim 27, wherein the laterally elongated conductive structure extends through the interface structure.

32. The bonded structure of claim 27, wherein the laterally elongated conductive structure provides an effectively closed profile around the integrated device.

33. The bonded structure of claim 27, wherein the first element includes a first semiconductor region, a first nonconductive field region on the first semiconductor region, and a first plurality of conductive contact pads at least partially embedded in the first nonconductive field region, the interface structure including the first nonconductive field region and the first plurality of conductive contact pads.

34. The bonded structure of claim 33, wherein the second element includes a second semiconductor region, a second nonconductive field region on the second semiconductor region, and a second plurality of conductive contact pads at least partially embedded in the second nonconductive field region, the interface structure including the second nonconductive field region and the second plurality of conductive contact pads, the first nonconductive field region directly bonded to the second nonconductive field region and the first plurality of conductive contact pads directly bonded to the second plurality of conductive contact pads.

35. The bonded structure of claim 34, wherein the interface structure comprises a trace embedded in the second nonconductive field region between the second plurality of conductive contact pads and the second semiconductor region.

36. The bonded structure of claim 35, wherein the trace connects a first conductive contact pad of the second plurality of conductive contact pads to a second conductive contact pad of the second plurality of conductive contact pads.

37. The bonded structure of claim 27, wherein the laterally elongated conductive structure is exposed on an outermost surface of the bonded structure.

38. The bonded structure of claim 37, wherein the exposed laterally elongated conductive structure is closer to a side edge of the first element than to the integrated device.

39. A method of forming a bonded structure comprising:
providing a first element comprising a first contact pad at a bonding surface of the first element;
providing a second element comprising a second contact pad at a bonding surface of the second element;
directly bonding the first contact pad of the first element to the second contact pad of the second element along an interface structure without an intervening adhesive, the interface structure providing mechanical and electrical connection between the first and second elements;
forming, after said directly bonding, a laterally elongated channel from a back side of the first element, through a semiconductor region of the first element, to at least the interface structure; and
after forming the laterally elongated channel, providing a laterally elongated conductive structure within the channel, the laterally elongated conductive structure extending continuously around multiple sides of an integrated device coupled to or formed in the first element or the second element.

40. The method of claim 39, wherein bonding comprises directly bonding a first nonconductive field region of the first element to a second nonconductive field region of the second element along the interface structure without an intervening adhesive.

41. The method of claim 39, wherein forming the elongated channel comprises forming the elongated channel from the back side of the first element to at least the bonding surface of the second element.

42. The method of claim 39, wherein providing the laterally elongated conductive structure comprises coating a bottom surface and a side surface of the channel with a conductive material.

43. A bonded structure comprising:
a first element having a front side and a back side opposite the front side, the first element having a first nonconductive field region and a first plurality of conductive contact pads at least partially embedded in the first nonconductive field region, the first nonconductive field region and the first plurality of conductive contact pads disposed on a semiconductor region of the first element;
a second element having a second nonconductive field region and a second plurality of conductive contact pads at least partially embedded in the second nonconductive field region, the second plurality of contact pads directly bonded to the first plurality of contact pads and the second nonconductive field region directly bonded to the first nonconductive field region along a bonding interface without an intervening adhesive, at least some of the directly bonded contact pads providing electrical communication between the first and second elements;
an integrated device coupled to or formed with the first element or the second element; and
a laterally elongated conductive structure comprising a trench extending from the back side of the first element through the semiconductor region and at least a portion of the first nonconductive field region, the laterally elongated conductive structure comprising a conformally-filled via including a conductive layer conformally coating an interior of the trench, the laterally elongated conductive structure extending continuously around at least two sides of the integrated device.

44. The bonded structure of claim 43, wherein the trench terminates within the first nonconductive field region.

45. The bonded structure of claim 43, wherein the trench terminates over a pad of the first plurality of conductive contact pads.

46. The bonded structure of claim 44, wherein the trench terminates at and contacts the pad of the first plurality of conductive contact pads.

47. The bonded structure of claim 43, wherein the trench extends across the bonding interface.

48. The bonded structure of claim 43, wherein the laterally elongated conductive structure is exposed on an outermost surface of the bonded structure.

49. The bonded structure of claim 48, wherein the exposed laterally elongated conductive structure is closer to a side edge of the first element than to the integrated device.

* * * * *